United States Patent
Shao et al.

(10) Patent No.: US 9,645,262 B2
(45) Date of Patent: May 9, 2017

(54) CAPACITANCE REDUCTION FOR PILLAR STRUCTURED DEVICES

(71) Applicant: Lawrence Livermore National Security, LLC, Livermore, CA (US)

(72) Inventors: Qinghui Shao, Fremont, CA (US); Adam Conway, Livermore, CA (US); Rebecca J. Nikolic, Oakland, CA (US); Lars Voss, Livermore, CA (US); Ishwara B. Bhat, Clifton Park, NY (US); Sara E. Harrison, Fremont, CA (US)

(73) Assignees: Lawrence Livermore National Security, LLC, Livermore, CA (US); Ishwara B. Bhat, Clifton Park, NY (US)

( * ) Notice: Subject to any disclaimer, the term of this patent is extended or adjusted under 35 U.S.C. 154(b) by 349 days.

(21) Appl. No.: 14/555,463

(22) Filed: Nov. 26, 2014

(65) Prior Publication Data
US 2016/0356901 A1    Dec. 8, 2016

(51) Int. Cl.
*G01T 3/00*    (2006.01)
*G01T 3/08*    (2006.01)
*H01L 31/117*    (2006.01)

(52) U.S. Cl.
CPC ............. *G01T 3/08* (2013.01); *H01L 31/117* (2013.01)

(58) Field of Classification Search
CPC ....................................................... G01T 3/08
USPC .................................................... 250/390.01
See application file for complete search history.

(56) References Cited

U.S. PATENT DOCUMENTS

| 2013/0075848 A1* | 3/2013 | Nikolic | H01L 31/085 257/429 |
| 2013/0187056 A1* | 7/2013 | Nikolic | G01T 3/008 250/370.05 |
| 2013/0334541 A1 | 12/2013 | Voss et al. | |

OTHER PUBLICATIONS

Huang et al., "High detection efficiency micro-structured solid-state neutron detector with extremely low leakage current fabricated with continuous P—N junction," Applied Physics Letters, vol. 102, 2013, pp. 152107-1-152107-4.

(Continued)

*Primary Examiner* — Edwin Gunberg
(74) *Attorney, Agent, or Firm* — Zilka Kotab

(57) ABSTRACT

In one embodiment, an apparatus includes: a first layer including a n+ dopant or p+ dopant; an intrinsic layer formed above the first layer, the intrinsic layer including a planar portion and pillars extending above the planar portion, cavity regions being defined between the pillars; and a second layer deposited on a periphery of the pillars thereby forming coated pillars, the second layer being substantially absent on the planar portion of the intrinsic layer between the coated pillars. The second layer includes an n+ dopant when the first layer includes a p+ dopant. The second layer includes a p+ dopant when the first layer includes an n+ dopant. The apparatus includes a neutron sensitive material deposited between the coated pillars and above the planar portion of the intrinsic layer. In additional embodiments, an upper portion of each of the pillars includes a same type of dopant as the second layer.

20 Claims, 16 Drawing Sheets

(56) References Cited

OTHER PUBLICATIONS

Huang et al., "Scalable large-area solid-state neutron detector with continuous P—N junction and extremely low leakage current," Nuclear Instruments and Methods in Physics Research A, vol. 763, 2014, pp. 260-265.

Dahal et al.," Self-powered micro-structured solid state neutron detector with very low leakage current and high efficiency," Applied Physics Letters, vol. 100, 2012, pp. 243507-1-243507-4.

* cited by examiner

US 9,645,262 B2

CAPACITANCE REDUCTION FOR PILLAR STRUCTURED DEVICES

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to three dimensional semiconductor structures, and more particularly to three dimensional semiconductor structures having a low capacitance and/or leakage current, which may be especially useful for thermal neutron detection applications.

BACKGROUND

The ability to detect neutrons is a vital tool for many applications, particularly, nonproliferation of special nuclear material (SNM). Since neutrons have no charge and do not interact significantly with most materials, neutron converters are needed to react with neutrons to produce charged particles that can be easily detected by semiconductor devices to generate electrical signals.

Conventional $^3$He proportional tubes are simple neutron detectors that may achieve high thermal neutron detection efficiency. For example, a 2-inch diameter tube filled with 10 atm of $^3$He gas may reach 80% detection efficiency, although the detector normally operates at lower pressure settings thereby reducing the efficiency. However, the use of these proportional counter type devices is somewhat encumbered by the required high voltage operation (1000 V), sensitivity to microphonics, and high pressure; resulting in significant complications in routine deployment and air transport.

Solid state thermal neutron detection techniques generally utilize a planar semiconductor detector over which a neutron reactive film has been deposited. Upon a surface of the semiconductor detector is attached a coating that responds to ionizing radiation reaction products upon the interaction with a neutron. The ionizing radiation reaction products can then enter into the semiconductor material of the detector thereby creating a charge cloud of electrons and holes, which can be sensed to indicate the occurrence of a neutron interaction within the neutron sensitive film. The charges are swept through such configured detectors via methods known by those of ordinary skill in the art and registered as an electrical signal.

Another geometry includes etched trenches, slots, or holes in semiconductor materials having dimensions on the micron scale or larger that are filled with predetermined converter materials and configured with electrodes so as to produce detectors similar to the planar detector geometries discussed above.

Conventional solid state radiation detectors, however, suffer from efficiency, flexibility and scalability issues.

SUMMARY

According to one embodiment, an apparatus includes: a first layer including a n+ dopant or a p+ dopant; an intrinsic layer grown or deposited above the first layer, the intrinsic layer including planar portions and pillars extending above the planar portion, where cavity regions are defined between the pillars; and a second layer deposited on a periphery of the pillars thereby forming coated pillars, where the second layer is substantially absent on the planar portion of the intrinsic layer between the coated pillars, where the second layer includes a n+ dopant when the first layer includes a p+ dopant, and where the second layer includes a p+ dopant when the first layer includes a n+ dopant. The apparatus additionally includes a neutron sensitive material deposited between the coated pillars and above the planar portion of the intrinsic layer.

According to another embodiment, an apparatus includes: a first layer including a n+ dopant or a p+ dopant; an intrinsic layer grown or deposited above the first layer, the intrinsic layer including planar portions and pillars extending above the planar portion, where cavity regions are defined between the pillars; and a second layer deposited on a periphery of the pillars thereby forming coated pillars, where the second layer is substantially absent on the planar portion of the intrinsic layer between the coated pillars, where the second layer includes a p+ dopant when the first layer includes a n+ dopant, and where the second layer includes a n+ dopant when the first layer includes a p+ dopant. At least one of the first layer, the intrinsic layer and the second layer includes an III-V or II-VI semiconductor material. The apparatus further includes: a passivation layer deposited on the planar portion of the intrinsic layer between the coated pillars, where the passivation layer includes at least one of a dielectric material and a polymeric material; a neutron sensitive material deposited between the coated pillars and above the passivation layer; a first electrode in contact with the coated pillars; and a second electrode in contact with the first layer.

Other aspects and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, reference should be made to the following detailed description read in conjunction with the accompanying drawings.

Figure 8:
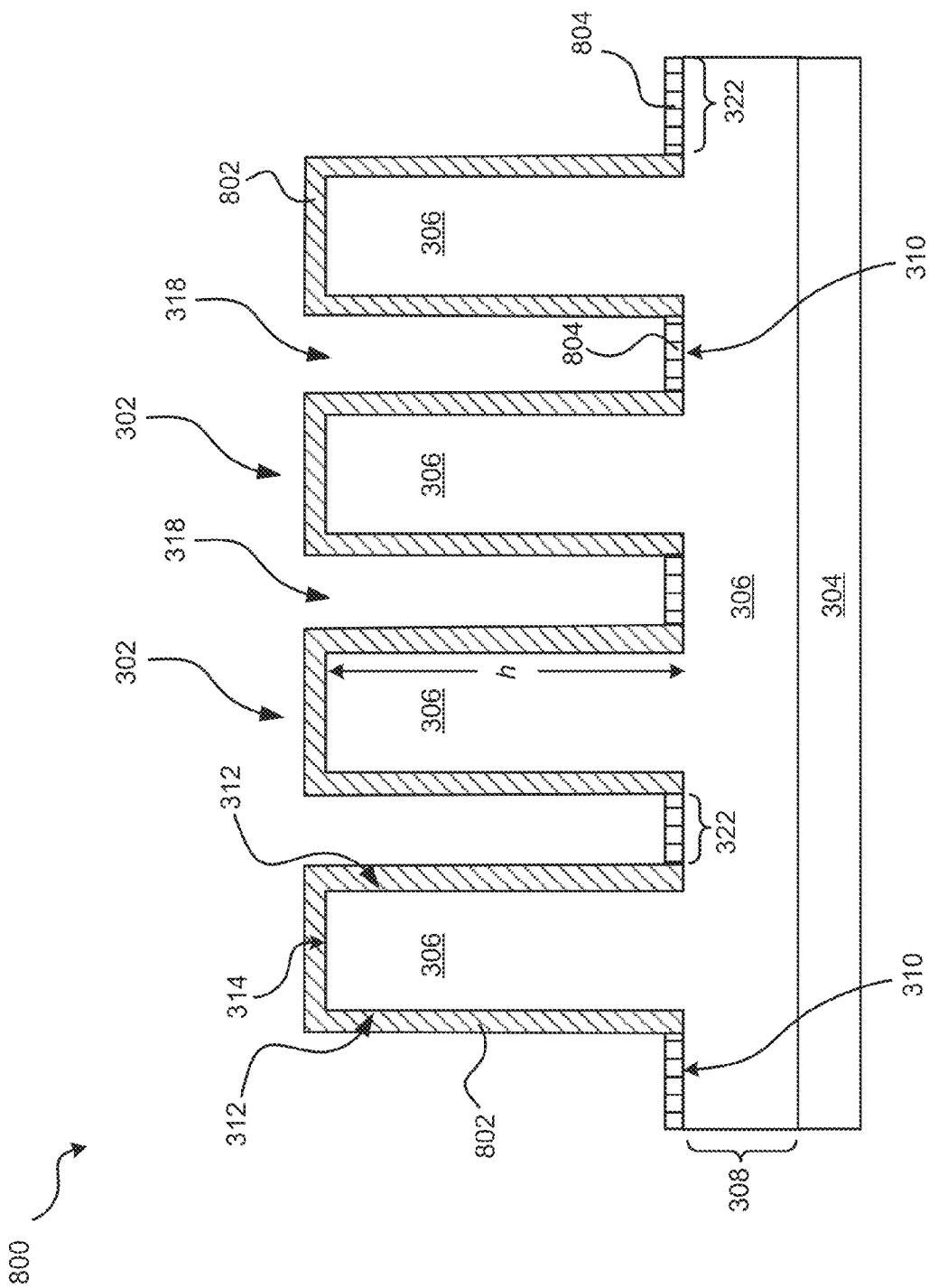

FIG. 8 shows a simplified schematic of an apparatus including a three dimensional array of pillars and a selective wrap-around p-type conductive layer, according to one embodiment.

Figure 9:
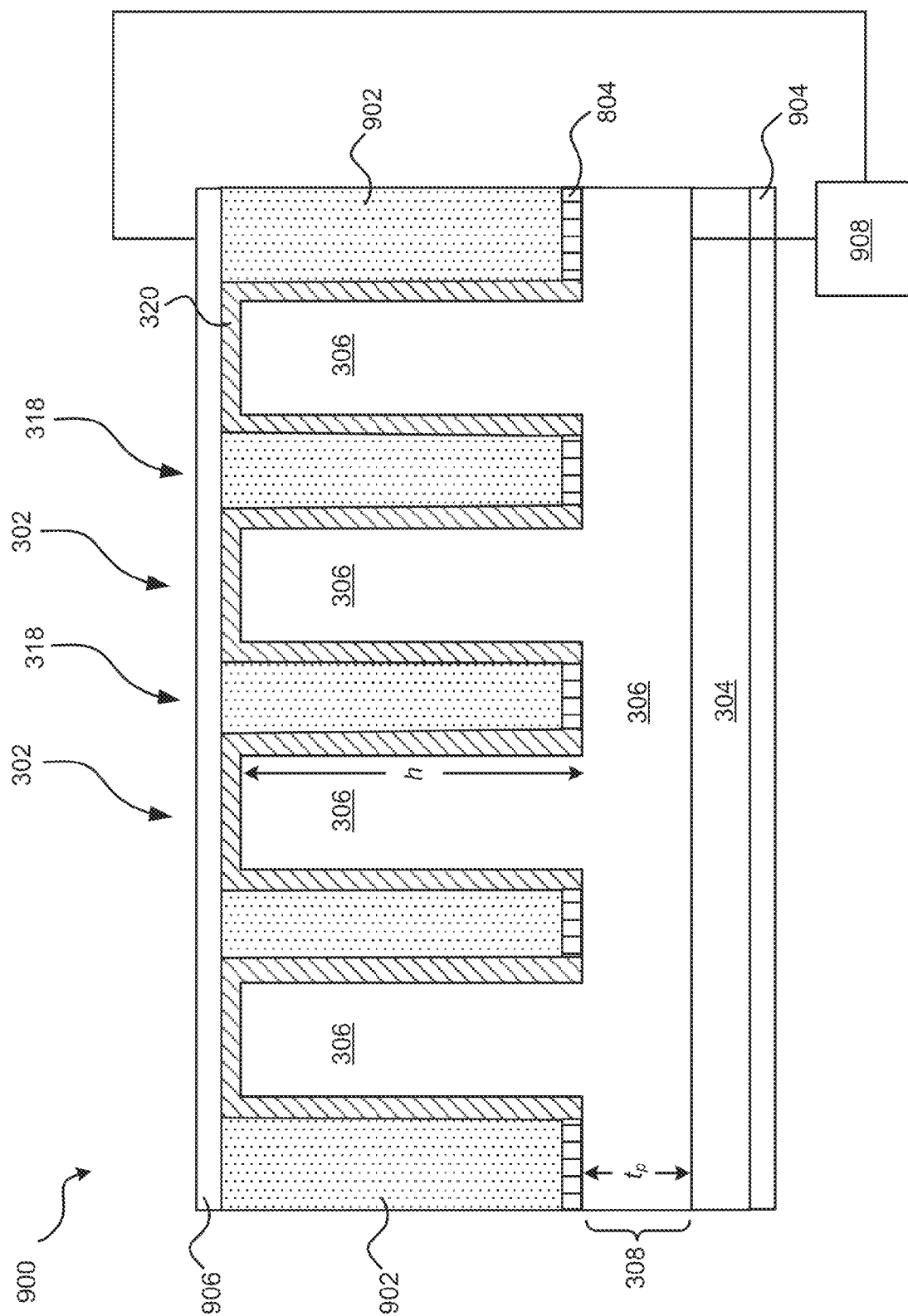

FIG. 9 shows a simplified schematic of a thermal neutron detector including the apparatus of FIG. 8, according to one embodiment.

Figure 10:
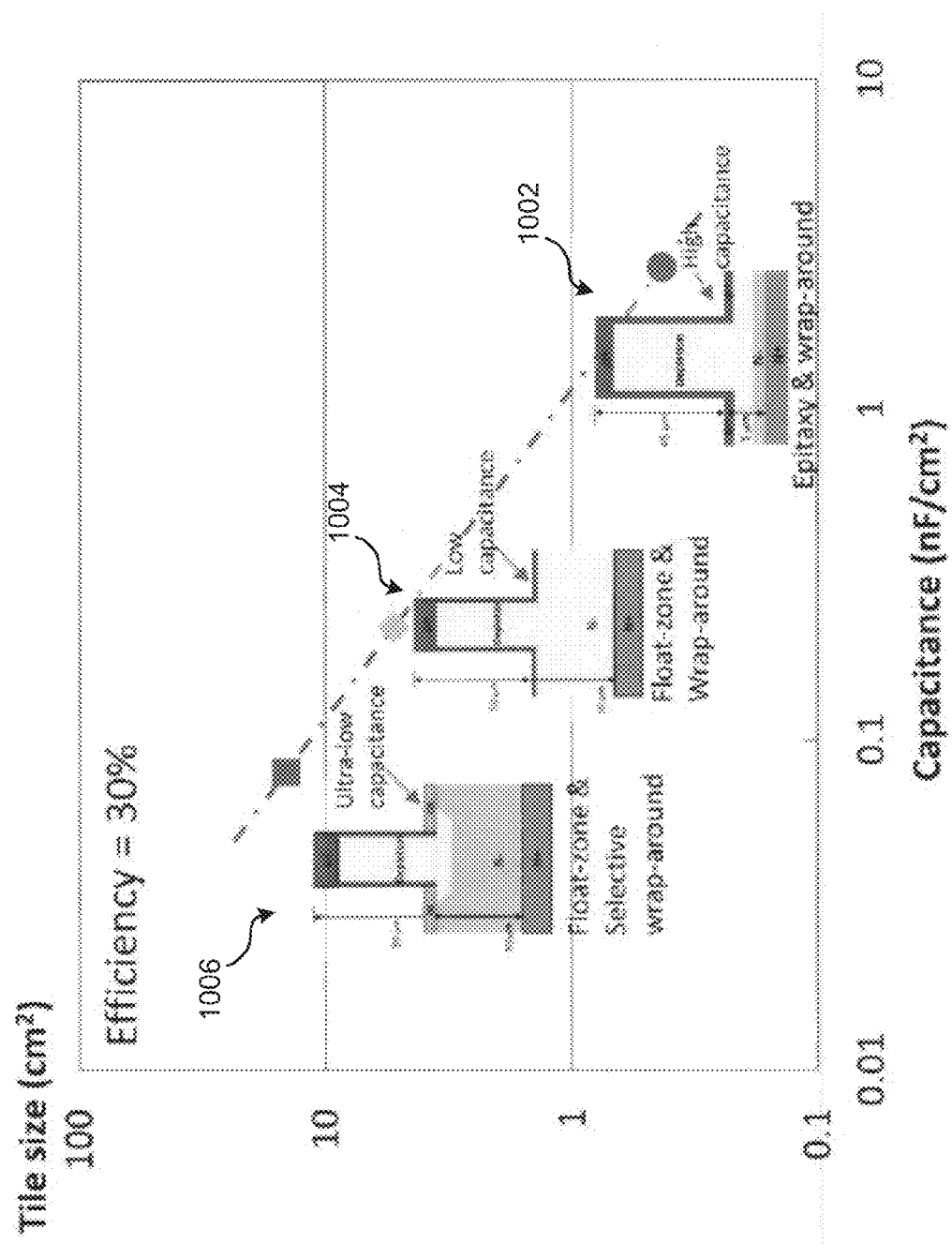

FIG. 10 shows a plot of detector size (tile size) versus capacitance for various three dimensional p-i-n semiconductor detectors.

Figure 11:
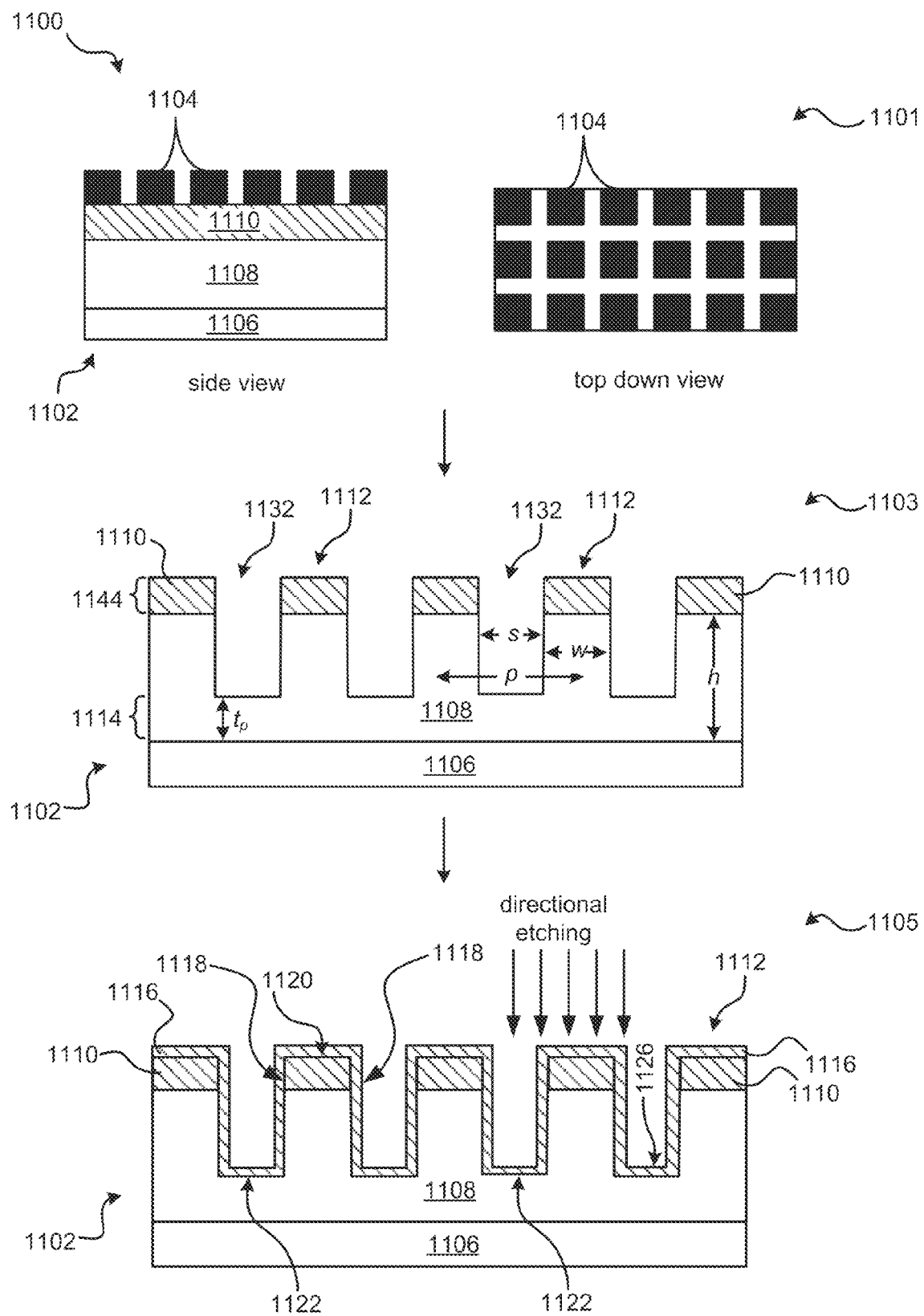
Figure 11:
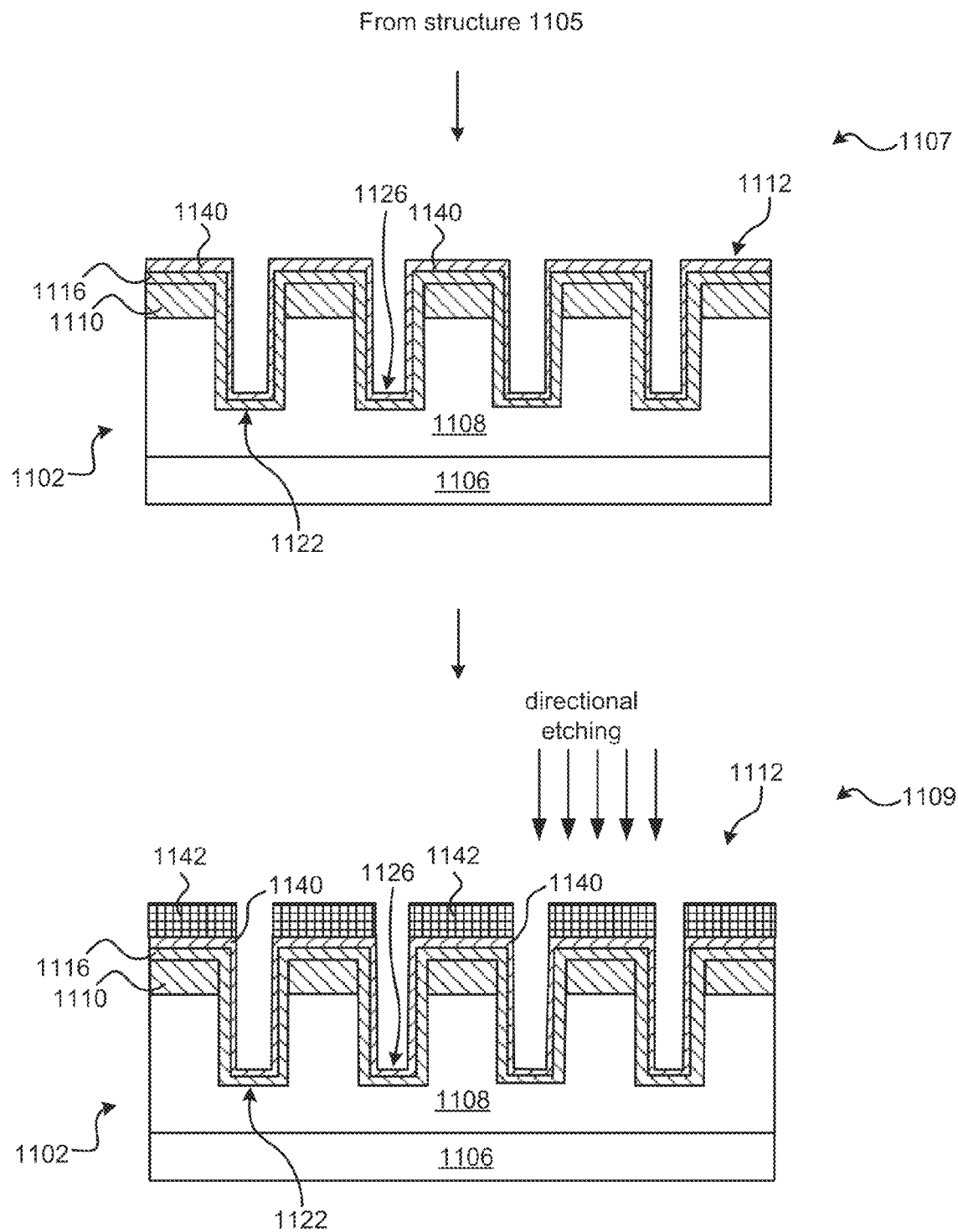
Figure 11:
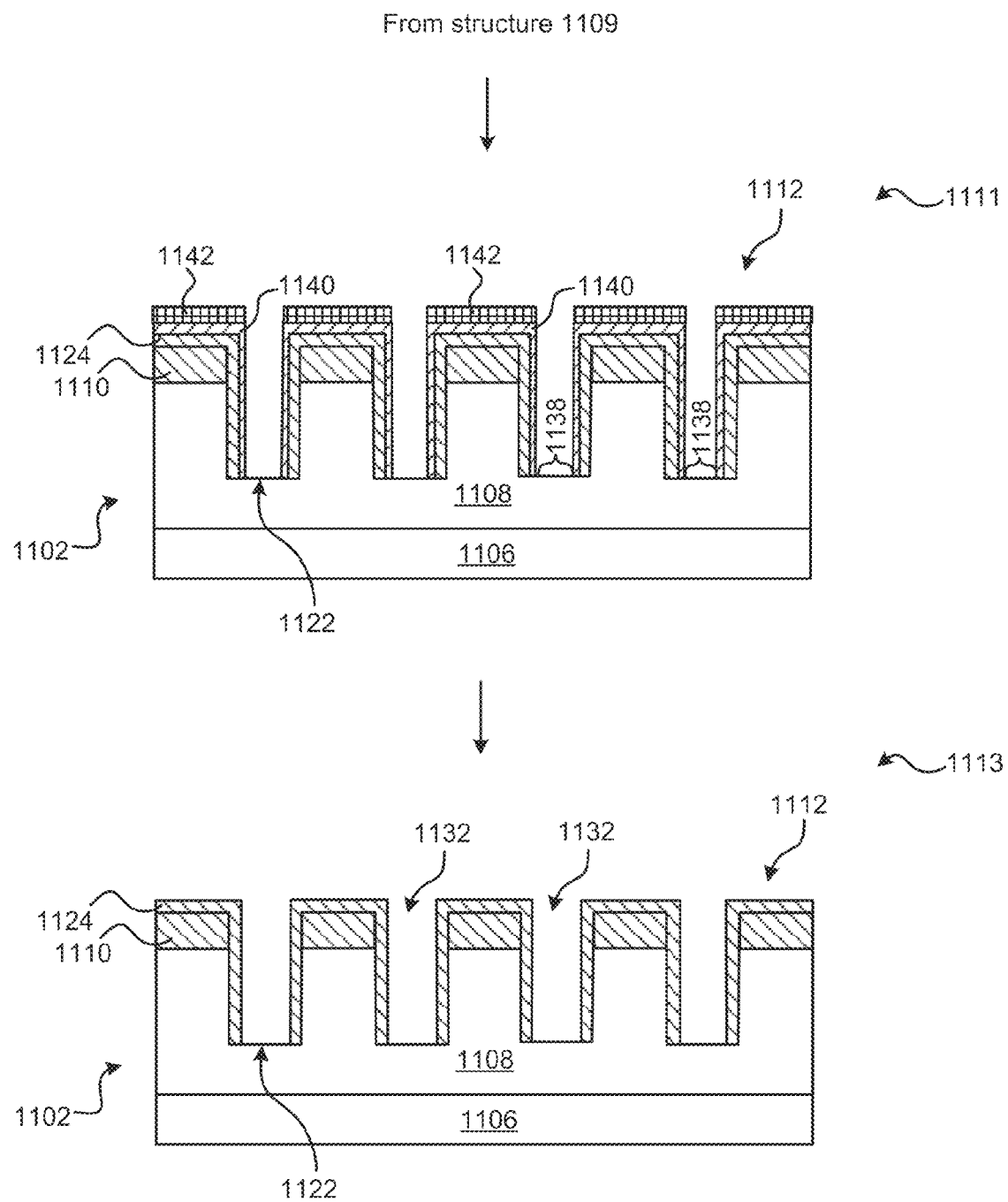
Figure 11:
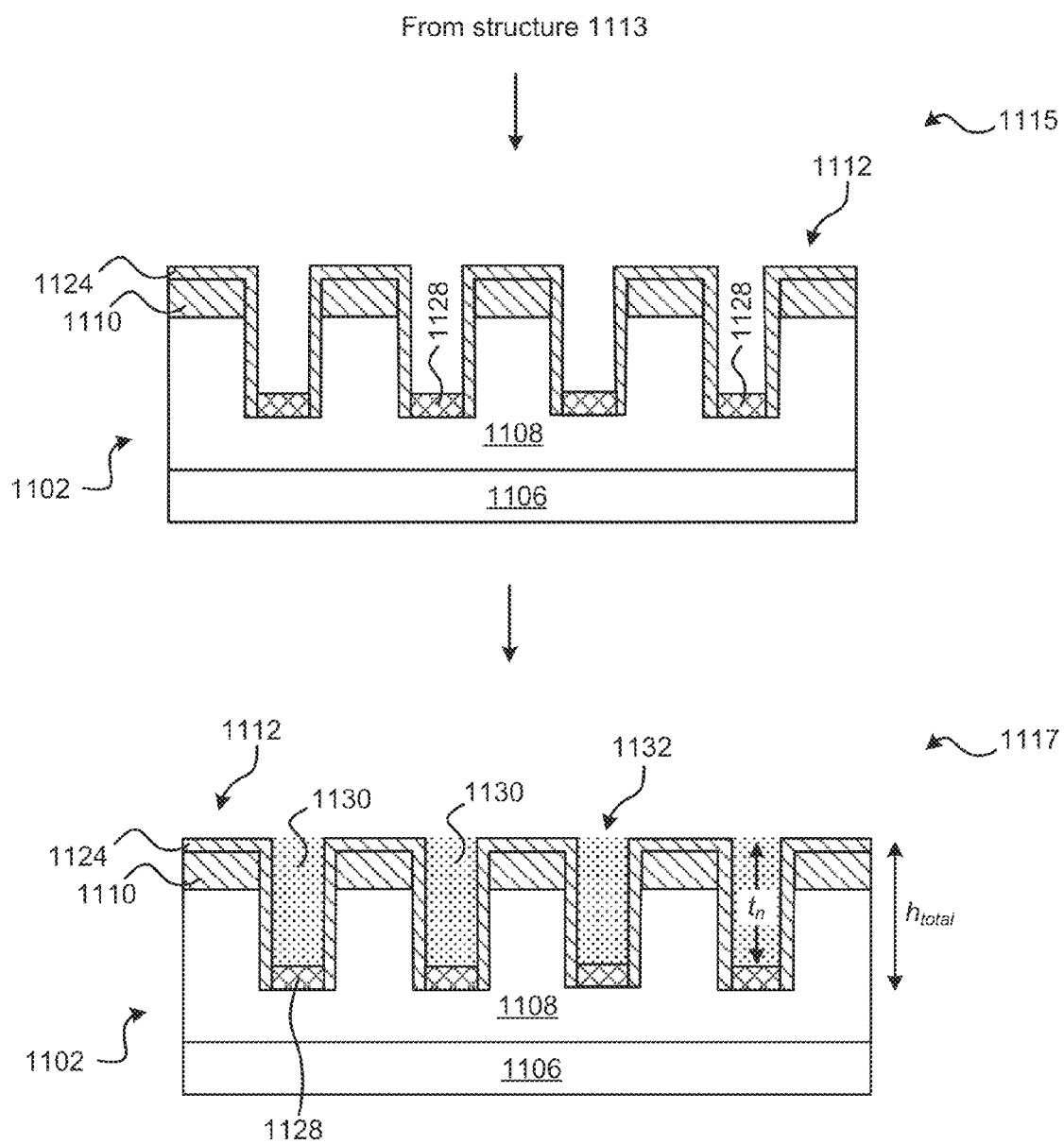
Figure 11:
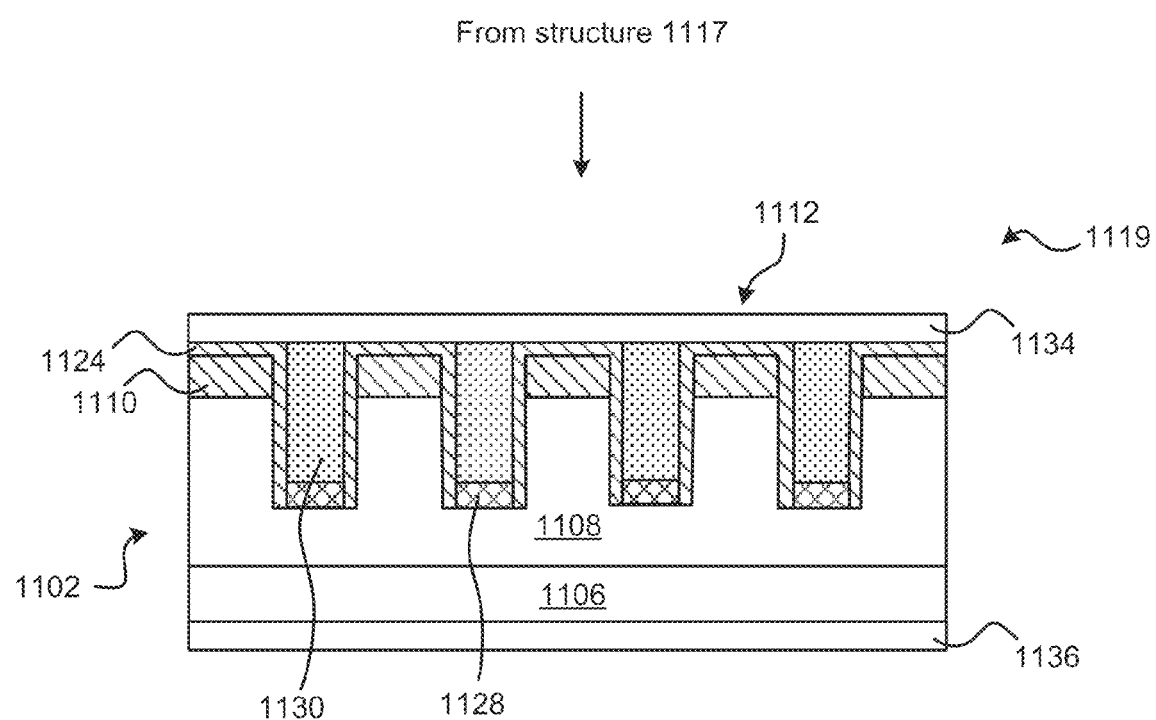

FIG. 11 shows a flowchart of a method for fabricating a three dimensional array of p-i-n structures, according to one embodiment.

Figure 12:
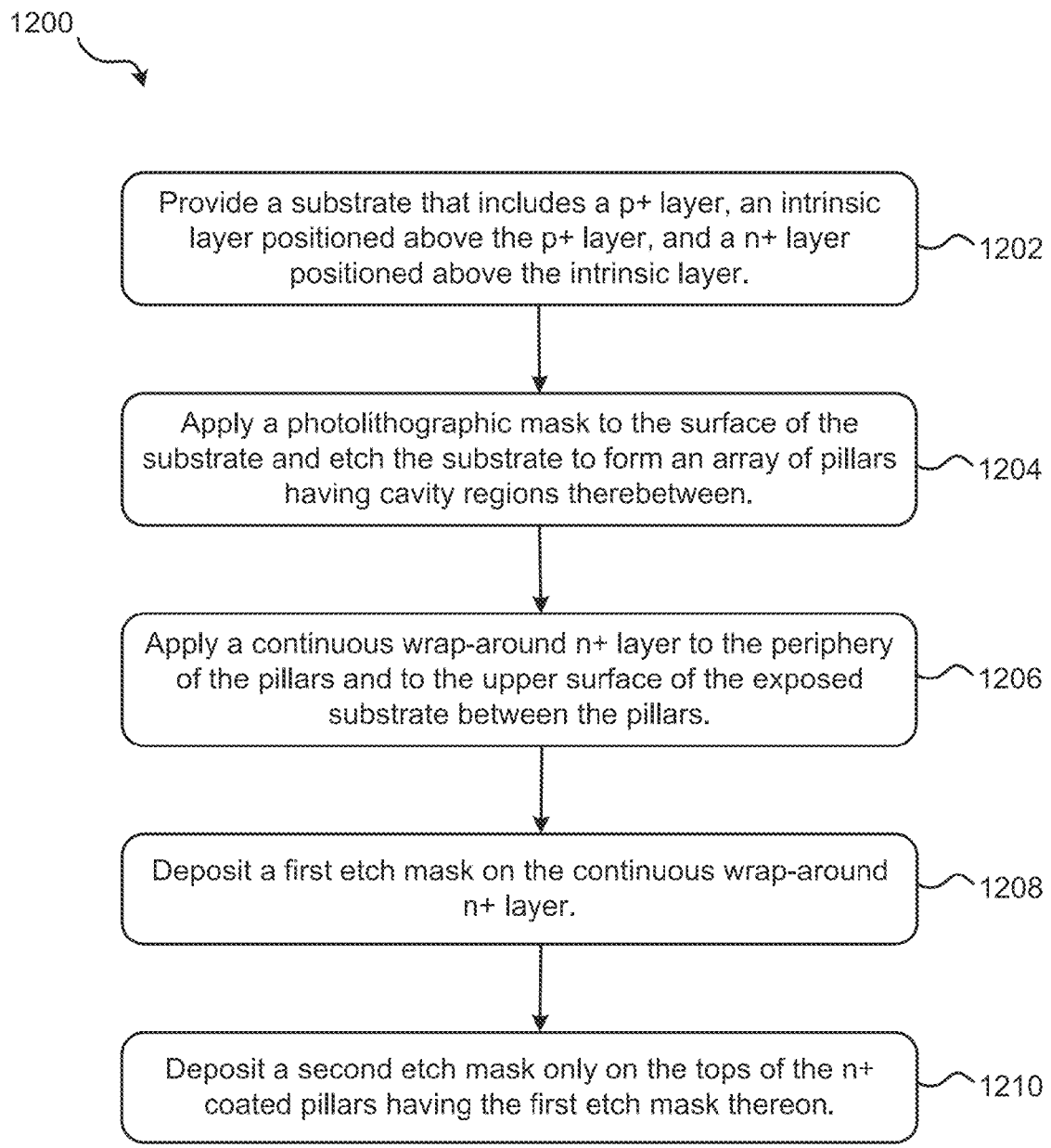
Figure 12:
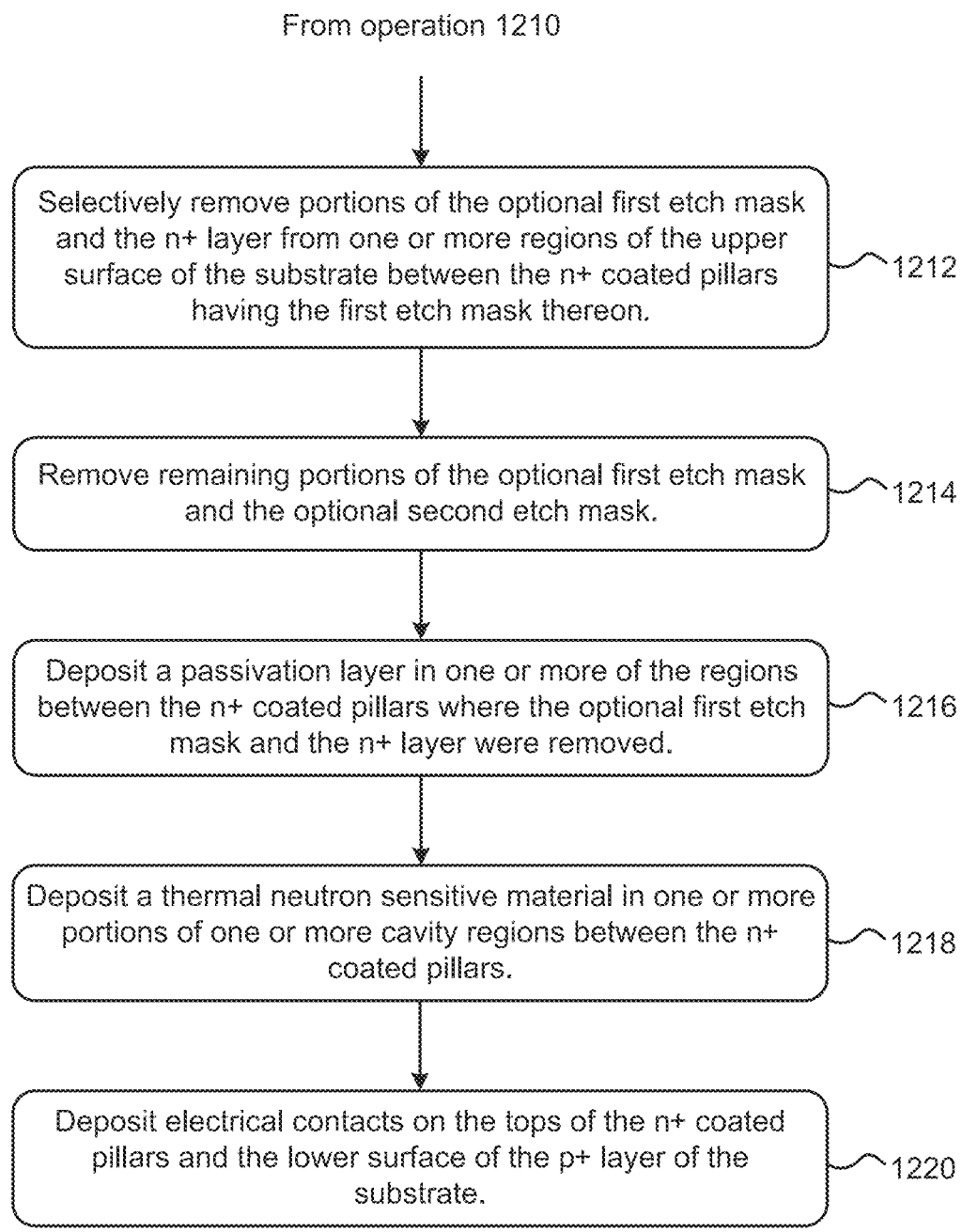

FIG. 12 shows a flowchart of a method for fabricating a three dimensional array of n-i-p structures, according to one embodiment.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As also used herein, the term "about" when combined with a value refers to plus and minus 10% of the reference value. For example, a length of about 1000 nm refers to a length of 1000 nm±100 nm, a temperature of about 50° C. refers to a temperature of 50° C.±5° C., etc.

The following description discloses several general, specific and preferred embodiments directed to capacitance reduction in three dimensional semiconductor structures and/or related systems and methods.

In one general embodiment, an apparatus includes: a first layer including a n+ dopant or a p+ dopant; an intrinsic layer formed (e.g., grown or deposited) above the first layer, the intrinsic layer including planar portions and pillars extending above the planar portion, where cavity regions are defined between the pillars; and a second layer deposited on a periphery of the pillars thereby forming coated pillars, where the second layer is substantially absent on the planar portion of the intrinsic layer between the coated pillars, where the second layer includes a n+ dopant when the first layer includes a p+ dopant, and where the second layer includes a p+ dopant when the first layer includes a n+ dopant. The apparatus additionally includes a neutron sensitive material deposited between the coated pillars and above the planar portion of the intrinsic layer.

In another general embodiment, an apparatus includes: a first layer including a n+ dopant or a p+ dopant; an intrinsic layer formed (e.g., grown or deposited) above the first layer, the intrinsic layer including planar portions and pillars extending above the planar portion, where cavity regions are defined between the pillars; and a second layer deposited on a periphery of the pillars thereby forming coated pillars, where the second layer is substantially absent on the planar portion of the intrinsic layer between the coated pillars, where the second layer includes a p+ dopant when the first layer includes a n+ dopant, and where the second layer includes a n+ dopant when the first layer includes a p+ dopant. At least one of the first layer, the intrinsic layer and the second layer includes an III-V or II-VI semiconductor material. The apparatus further includes: a passivation layer deposited on the planar portion of the intrinsic layer between the coated pillars, where the passivation layer includes at least one of a dielectric material and a polymeric material; a neutron sensitive material deposited between the coated pillars and above the passivation layer; a first electrode in contact with the coated pillars; and a second electrode in contact with the first layer.

As discussed previously, neutron detection is an important method for determining nuclear material signatures. $^3$He gas filled tubes are widely used thermal neutron detectors due to their high capture cross-section of thermal neutrons, high interaction probability with thermal neutrons, low noise, and low gamma sensitivity. However, $^3$He gas tube detectors suffer from fieldability issues due to size, high operating voltage requirements, sensitivity to microphonics, and the limited supply of $^3$He gas.

Various solid state thermal neutron detectors have been proposed to replace $^3$He gas tube detectors. For example, a planar semiconductor p-n junction or metal-semiconductor junction on which a neutron converter film is applied may be used. Interaction of a thermal neutron with the neutron converter film generates energetic ions, which can then enter the semiconductor material and create electron-hole pairs. The electron-hole pairs are separated by a built-in electric field of the junction or external reverse bias and collected at contacts of the detector, thereby producing the external electrical signal. However, with such a planar semiconductor detector, the thickness of the neutron converter film necessary to achieve high neutron interaction probability may greatly exceed the range/track length for the energetic ions generated via nuclear reaction to reach the semiconductor material and create electron-hole pairs. Accordingly, such planar semiconductor detectors typically suffer from low neutron detection efficiency.

One approach for overcoming the low neutron detection efficiency associated with planar semiconductor detectors involves use of three dimensional high aspect ratio p-i-n diodes with a neutron sensitive material located in cavity regions between the p-i-n diodes. This three dimensional approach obtains high thermal neutron detection efficiency by decoupling geometrical constraints on the neutron converter material thickness and the limitation of the energetic ion track length requirement. For example the neutron converter film thickness necessary to achieve high neutron interaction probability is defined by the height of the p-i-n diodes (etch depth).

Figure 1:
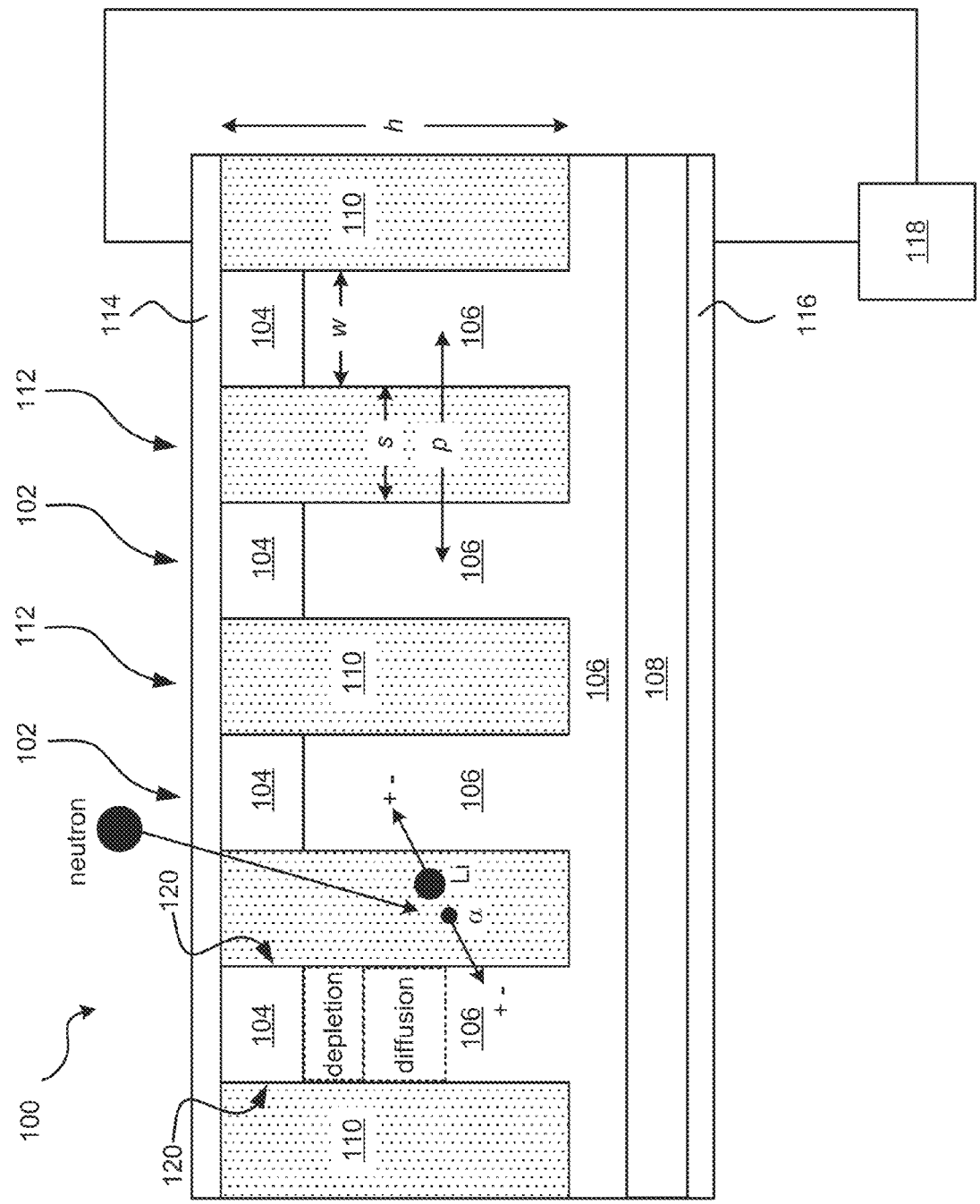
FIG. 1 shows a simplified schematic of a thermal neutron detector including a three dimensional array of high aspect ratio pillars, according to one embodiment.
Figure 2A:
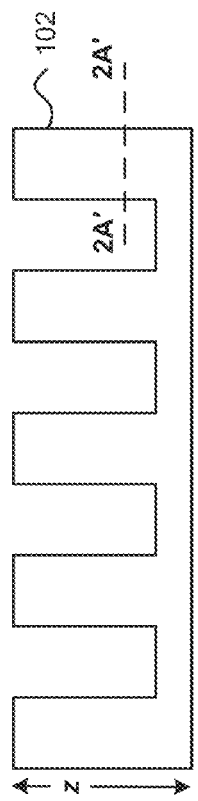
FIGS. 2A-2G show simplified schematics of particular cross sectional shapes of pillars, according to various embodiments.
Figure 2C:
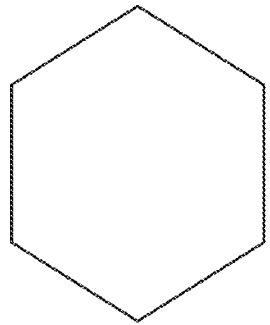
Figure 2D:
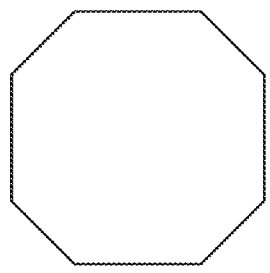
Figure 2F:
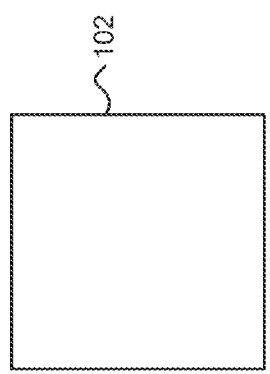
Figure 2B:
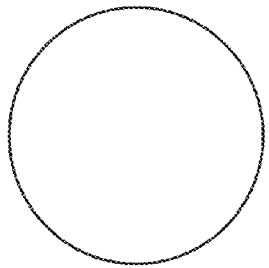
Figure 2G:
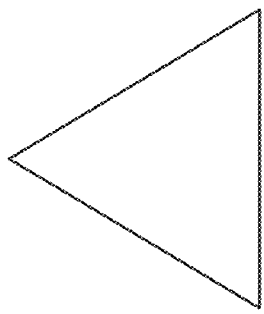
Figure 2E:
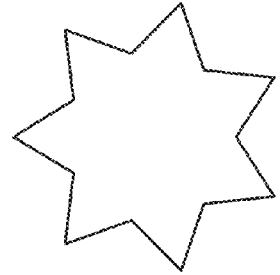

FIG. 1 illustrates a thermal neutron detector 100 including a three dimensional array of high aspect ratio pillars 102, according to one exemplary embodiment. As an option, the present thermal neutron detector 100 may be implemented in conjunction with features from any other embodiment listed herein, such as those described with reference to the other FIGS. Of course, such a thermal neutron detector 100 and others presented herein may be used in various applications and/or permutations, which may or may not be specifically described in the illustrative embodiments listed herein.

As shown in FIG. 1, each of the pillars 102 forms a p-i-n diode, and include, from top to bottom: a p+ layer 104, an intrinsic layer (n−) 106 and a n+ layer 108. With such a configuration, the depletion and diffusion areas do not extend across the entire intrinsic layer 106. Accordingly, recombination of charges generated outside of depletion and diffusion area may lead to decreased charge collection efficiency.

In some approaches, each of the p-i-n pillars 102 may include a semiconductor material. In particular approaches, the semiconductor material may include at least one of Si, SiC, Ge, GaAs, AlGaAs, GaP, GaN, InN, InP, AlGaN, etc. or other suitable semiconductor material as would become apparent to one skilled in the art upon reading the present disclosure. In preferred approaches, the semiconductor material may include or be silicon.

In various approaches, the pillars 102 may have a high aspect ratio, thus the effect of neutrons streaming through the pillars without passing through the neutron sensitive material is negligible, e.g. less than about 1%. For example, one or more of the pillars 102 may have an aspect ratio (i.e., the ratio of the height of the pillar relative to its width and/or pitch) in a range from about 1:1 to about 1000:1 (e.g., about 1:1, about 10:1, about 25:1, about 50:1, about 100:1, etc.) or higher depending on the application.

In particular approaches, one or more of the pillars 102 may have a maximum width, w, in a range from about 0.1 to about 10 μm in some approaches. In additional approaches, one or more of the pillars 102 may also have a height (e.g. an etch depth), h, in a range from about 2 to about 100 μm, e.g., about 50 μm preferably. In more approaches, the pitch (center-to-center spacing), p, between at least two adjacent pillars 102 may be in a range from about 2 to about 10 μm. In yet more approaches, the separation, s, between at least two adjacent pillars 102 may be in a range from about 1 μm to about 10 μm. It is important to note, however, that said dimensions (width, pitch, height, aspect ratio, etc.) of the pillars 102 serve only as an example and are not limiting in any way, thus various embodiments may have larger or smaller dimensions.

Illustrative, non-limiting cross sectional shapes of the pillars 102 are shown in FIGS. 2A-2G. For example, as shown in FIGS. 2A-2G, illustrative cross sectional shapes of a pillar 102, as would be seen if viewed in cross section along a plane (denoted by line 2A') oriented perpendicular to its longitudinal axis (z), may include, but are not limited to: a square (FIG. 1B), octagon (FIG. 1C), hexagon (FIG. 1D), star (FIG. 1E), triangle (FIG. IF), circle (FIG. 1G), etc., or other such suitable shapes. In preferred approaches, each of the pillars 102 may comprise a rounded cross sectional shape (e.g., a circular shape, ellipsoid shape, etc.).

It is important to note, however, that the array of pillars 102 shown in FIG. 1 is not limited to an array of individual pillar structures, but may include an array of ridges or other suitable three dimensional structures as would become apparent to one having skill in the art upon reading the present disclosure.

As also shown in FIG. 1, a neutron sensitive material 110 may be deposited in the cavity regions 112 between each pillar 102 in the array. The cavity regions 112 are those areas void of pillars 102 in the thermal neutron detector 100.

In various approaches, the neutron sensitive material 110 may include an atomic or molecular medium, a polymer, semiconductor, dielectric, etc. In particular approaches, the neutron sensitive material 110 may be boron-10 ($^{10}B$); a compound containing $^{10}B$ (e.g., natural boron, natural boron carbide, $^{10}B$ nitride, etc.); lithium (Li) (e.g., pure $^{6}Li$); a compound containing $^{6}Li$ (e.g., $^{6}Li$ fluoride); $^{155}Gd$; $^{157}Gd$; a compound containing $^{6}Li$ (e.g., $^{6}Li$ fluoride); $^{155}Gd$; $^{157}Gd$; a or other suitable neutron sensitive/conversion material as would become apparent to one having skill in the art upon reading the present disclosure. In preferred approaches, the neutron sensitive material 110 may be $^{10}B$.

The neutron sensitive material 110 (e.g. $^{10}B$) deposited in the cavity regions 112 between the pillars 102 may possess a relatively high cross section for thermal neutron interactions. For instance, as depicted in FIG. 1, interaction between a neutron and the neutron sensitive material (e.g. $^{10}B$) results in the generation of alpha and $^{7}Li$ particles. These particles subsequently interact with the material of the pillars 102 to produce electron-hole pairs. A voltage may then be applied to a pair of electrical contacts (e.g., electrodes) 114, 116 coupled to the upper and/or lower surfaces of the thermal neutron detector 100 to promote the collection of the electrical signals generated by the electron-hole pairs. Processing hardware 118 of a type known in the art may be coupled to the contacts 114, 116 for detecting, processing, etc. the electrical signals generated by the neutron interaction with the neutron sensitive material 110. Any known detector components (e.g. pre-amplifiers, amplifiers, multichannel analyzers, computers, etc.) may be used in combination with the novel structures presented herein to create neutron detectors, according to various embodiments.

In exemplary approaches, the thermal neutron detector 100 of FIG. 1 including the three dimensional array of high aspect ratio pillars 102 may offer various advantages over conventional neutron detectors, such as $^{3}He$ tubes and planar solid-state thermal detectors. For example, the thermal neutron detector 100 may be configured to operate at a low voltage (e.g. less than about 5V); may be insensitive to vibrations and consequently well suited for handheld deployment/use; may achieve a high thermal neutron detection efficiency (e.g. greater than about 50%); may substantially discriminate between neutron and gamma ray measurement signals, preferably achieving a gamma discrimination of about $10^5$; may be cost effective to fabricate/produce; may comprise a compact size, e.g. 1×1×0.1 cm, etc. Additional embodiments of thermal neutron detectors with features and/or properties that may be used in conjunction with the thermal neutron detector 100 of FIG. 1 are found in U.S. patent application Ser. No. 13/912,885, filed Jun. 7, 2013, and U.S. patent application Ser. No. 13/742,298, filed Jan. 15, 2013, which are herein incorporated by reference in their entirety.

However, one drawback with the thermal neutron detector 100 of FIG. 1 is that the thermal neutron detection efficiency decreases with an increase in detector area due to electronic noise. Electronic noise is related to the detector's leakage current and capacitance. As both leakage current and capacitance scale with device area, the electronic noise signal increases with increasing detector area size thereby making it more difficult to distinguish the actual signal due to the interaction of neutrons with the pillar detector from the electronic noise.

One source of the capacitance related electronic noise in the thermal neutron detector 100 of FIG. 1 may arise from the positive fixed charges that form on the sidewalls 120 of the pillars 102 during deposition (e.g., via chemical vapor deposition (CVD)) of the neutron sensitive material 110 in the cavity regions 112. For instance, consider an exemplary approach where the three dimensional array of pillars 102 is made of silicon, has an average pillar width and pitch of 2 μm and 4 μm, respectively, and an n-type doping concentration of $1 \times 10^4$ dopants/cm$^3$ in the intrinsic layer of each pillar 102. The ideal capacitance of this three dimensional array of pillars 102 is about 19.6% of the capacitance of a planar silicon p-i-n diode. A planar silicon p-i-n diode having the same n-type doping concentration of $1 \times 10^{14}$ dopants/cm$^3$ in its intrinsic region has a capacitance at 0 volts (V) of about 3.5 to about 3.8 nF/cm$^2$ determined by a depletion depth of about 3 µm. However, for the three dimensional silicon p-i-n pillar array, it has been found that the presence of the neutron sensitive material 110 (e.g., B$^{10}$) in the cavity regions 112 between the pillars 102 results in a positive fixed charge of about 10$^{10}$ cm$^{-2}$ on the sidewalls 120 thereof, which ultimately results in a detector capacitance at 0 V of about 5.8 nF/cm$^2$ to about 12.5 nF/cm$^2$ (typically about 7.6 nF/cm$^2$).

Additional embodiments disclosed herein overcome the aforementioned drawbacks by providing thermal neutron detectors with novel three dimensional structures that reduce the detector capacitance and improve charge collection efficiency, which may be particularly beneficial for large element size detectors or detector tiles. In various approaches, the novel three dimensional structures may comprise a p-i-n pillar array with a thin p-type conductive layer coating/wrapping the periphery (i.e., the sidewalls and tops) of the pillars and the areas at the base of and between the coated pillars. Removal of the thin p-type conductive layer from the areas at the base of and between the coated pillars may reduce the detector capacitance by as many as 50 times. Therefore, in preferred approaches, the novel three dimensional structures may comprise a p-i-n pillar array with a thin p-type conductive layer coating/wrapping only the periphery (i.e., the sidewalls and tops) of the pillars and not the areas at the base of and between the coated pillars.

Figure 3:
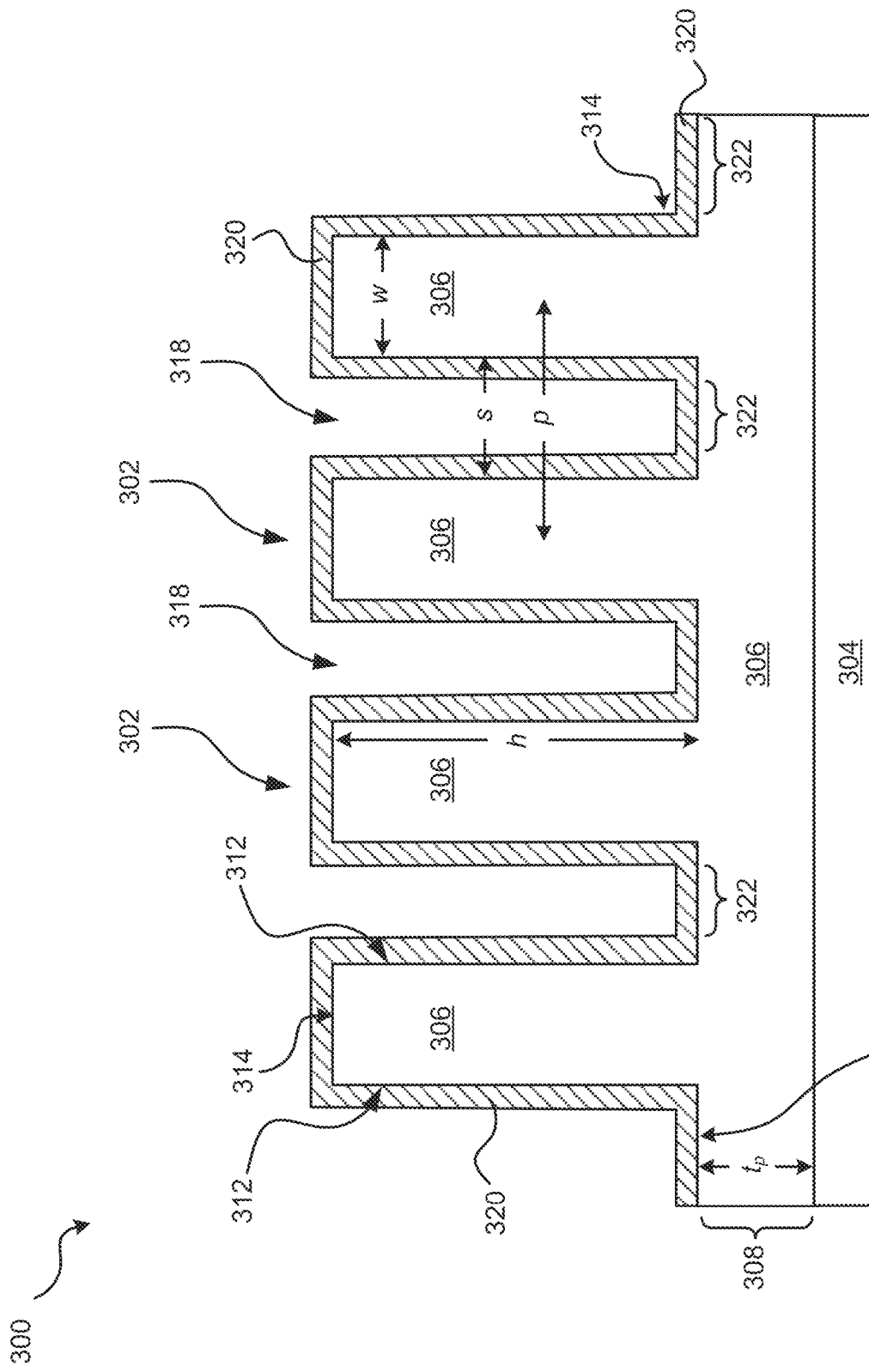
FIG. 3 shows a simplified schematic of an apparatus including a three dimensional array of high aspect ratio pillars and a continuous wrap-around p-type conductive layer, according to one embodiment.

Referring now to FIG. 3, an apparatus 300 including a three dimensional array of high aspect ratio pillars 302 and a continuous wrap-around p-type conductive layer 320 is shown, according to one embodiment. As an option, the present apparatus 300 may be implemented in conjunction with features from any other embodiment listed herein, such as those described with reference to the other FIGS. Of course, such an apparatus 300 and others presented herein may be used in various applications and/or permutations, which may or may not be specifically described in the illustrative embodiments listed herein.

As shown in FIG. 3, the apparatus 300 includes an n+ layer 304. In some approaches, the n+ layer 304 comprises a semiconductor material. For example, in particular approaches, the n+ layer 304 may comprise at least one of: Si, SiC, GaAs, AlGaAs, GaP, GaN, InN, InP, AlGaN, etc. or other suitable semiconductor material as would become apparent to one skilled in the art upon reading the present disclosure. In preferred approaches, the n+ layer 304 may include or be n+ doped silicon.

In more approaches, the n+ layer 304 may have a thickness in a range from 0.5 µm to about 500 µm. In still more approaches, the n+ layer 304 may have an n-type doping concentration in a range from about 1×10$^{18}$ cm$^{-3}$ to 1×10$^{19}$ cm$^{-3}$.

As also show in FIG. 3, the apparatus 300 includes an intrinsic (n−) layer 306 positioned above the n+ layer 304. In some approaches, the intrinsic layer 306 may include a semiconductor material. In particular approaches, the intrinsic layer 306 may include at least one of Si, SiC, Ge, GaAs, AlGaAs, GaP, GaN, InN, InP, AlGaN, etc. or other suitable material as would become apparent to one skilled in the art upon reading the present disclosure. In various approaches, the intrinsic layer 306 may include one or more materials that are the same or different than the material(s) present in the n+ layer 304. In preferred approaches, the intrinsic layer 306 may include or be n-type doped silicon.

In more approaches, the intrinsic layer 306 may have an n-type doping concentration in a range from about 1×10$^{11}$ dopants/cm$^3$ to about 1×10$^{16}$ dopants/cm$^3$.

As additionally shown in FIG. 3, the intrinsic layer 306 includes a planar portion 308 and pillars 302 that protrude from and extend above the upper surface 310 of the planar portion 308. Each of the pillars 302 has a periphery defined the sidewalls 312 and the top/upper surface 314 of the pillar. The base ("foot") 322 of each pillar 302 corresponds to the lowermost region (i.e., the region farthest from the top of the pillar in a direction parallel to the normal of the n+ layer) of the pillar immediately adjacent and in contact with the planar portion 308 of the intrinsic layer 306. Moreover, cavity regions 318 are positioned between, and thus separate, each of the pillars 302.

In some approaches, the planar portion 308 of the intrinsic layer 306 may have a thickness, $t_p$, in a range from 0 µm to about 500 µm.

In more approaches, one or more of the pillars 302 of the intrinsic layer 306 may have a maximum width, w, in a range from about 0.1 to about 10 µm in some approaches. One or more of the pillars 302 may also have a height (e.g. an etch depth), h, of about 0.1 to about 100 µm, e.g., about 50 µm in preferred approaches. Additionally, the pitch (center-to-center spacing), p, between at least two adjacent pillars 302 may be in a range from about 2 to about 10 µm and, and the separation, s, between at least two adjacent pillars 302 may be in a range from about 1 µm to about 10 µm in some approaches.

In various approaches, the separation between the pillars 302 in one or more portions of the pillar array may be about uniform. For instance, in one approach, the array of pillars 302 may be arranged in a hexagonally close packed (HCP) array. However, in other approaches, the separation between the pillars 302 in one or more portions of the pillar array may not be uniform.

In additional approaches, one or more of the pillars 302 may also have a high aspect ratio in a range of about 1:1 to about 1000:1 (e.g., about 1:1, about 10:1, about 25:1, about 50:1, about 100:1, etc.) or higher. It is important to note that said dimensions of the pillars 302 (width, pitch, height, separation, aspect ratio, etc.) serve only as an example and are not limiting in any way, thus various embodiments may have larger or smaller dimensions depending on the application.

In further approaches, the cross sectional shapes of the pillars 302, where the cross section is taken perpendicular to a longitudinal axis of the pillars 302, may include, but are not limited to: a square, octagon, hexagon, star, triangle, circle, ellipsoid, etc., or other such suitable shapes (see e.g., the illustrative cross sectional pillar shapes shown in FIGS. 2A-2G). Moreover, it is important to note that the array of pillars 302 shown in FIG. 3 is not limited to individual pillar structures, but may include ridges or other suitable three dimensional structures as would become apparent to one having skill in the art upon reading the present disclosure.

With continued reference to FIG. 3, the apparatus also includes a p+ layer 320 deposited directly on the periphery (i.e., the sidewalls 312 and the top/upper surface 314) of each of the pillars 302, as well as the upper surface 310 of the planar portion 308 of the intrinsic layer 306 between and/or adjacent to the p+ coated pillars (see e.g., regions 322). In various approaches, the p+ layer 320 shown in FIG. 3 may also be referred to as a "continuous wrap-around p+ layer" because the p+ layer 320 coats/wraps the periphery of each pillar 302 and the upper surface 310 of the planar portion 308 of the intrinsic layer 306 between and/or adjacent to the p+ coated pillars (see e.g., regions 322).

In some approaches, the continuous wrap-around p+ layer 320 may include a semiconductor material. In particular approaches, the continuous wrap-around p+ layer 320 may include at least one of Si, SiC, Ge, GaAs, AlGaAs, GaP, GaN, InN, InP, AlGaN, etc. or other suitable semiconductor material as would become apparent to one skilled in the art upon reading the present disclosure. In various approaches, the continuous wrap-around p+ layer 320 may include one or more materials that are the same or different than the material(s) present in the n+ layer 304 and/or the intrinsic layer 306. In preferred approaches, the continuous wrap-around p+ layer 320 may include or be p+ doped silicon.

In more approaches, a minimum thickness of the continuous wrap-around p+ layer 320 may be about 100 Å. In further approaches, a maximum thickness of the p+ layer 320 may be about 25% of the average maximum width of the pillars 302. In more approaches, the continuous wrap-around p+ layer 320 has a p-type doping concentration that is greater than or equal to about 100 times that of the n-type doping concentration in the intrinsic layer 306.

The continuous wrap-around p+ layer 320 passivates the surfaces of the intrinsic layer 306 on which it is deposited and eliminates the surface charge effect. The continuous wrap-around p+ layer 320 also creates an electric field which fully depletes the pillars 302 under zero applied bias. Generated charge carriers (both electrons and holes) may thus be transported through a fast drift process thereby greatly increasing the charge collection efficiency.

In particular approaches, the doping concentration and/or resistivity in the intrinsic layer 306 may be tuned for optimum electrical performance. For instance, it may be preferable to have a low enough n-type doping concentration in the intrinsic layer 306 to ensure full depletion by the continuous wrap-around p+ layer 320. However, a low n-type doping concentration in the intrinsic layer 306 may result in an unwanted increase of leakage current. Leakage current has two components: the saturation current in a space-charge region (scr) and a quasi-neutral region (qnr). A low doping concentration leads to a high qnr saturation current, and thus to a high leakage current. Nonetheless, in various approaches, a highly resistive (low doping) intrinsic layer 306 may be desirable at the expense of a relatively high leakage current. In approaches where the intrinsic layer 306 includes silicon, has a n-type doping concentration of about $1 \times 10^{14}$ cm$^{-3}$ and is fully depleted, the capacitance of the apparatus 300 at 0 V may be an range from about 2.0 to about 3.0 nF/cm$^2$ (typically about 2.8 nF/cm$^2$) and may be dominated by the regions of the planar portion 308 of the intrinsic layer 306 that have the p+ deposited thereon.

Figure 4:
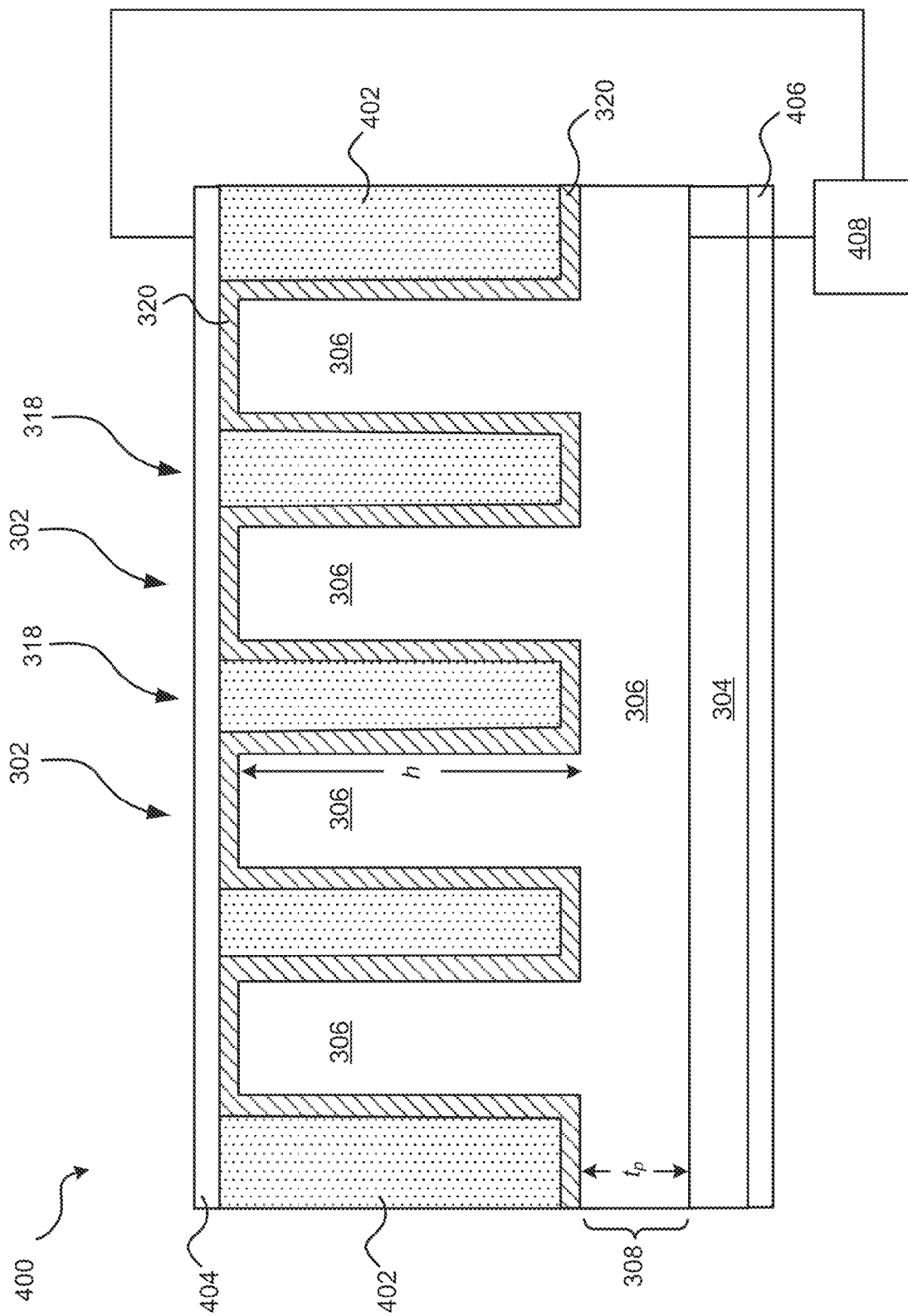
FIG. 4 shows a simplified schematic of a thermal neutron detector including the apparatus of FIG. 3, according to one embodiment.

The apparatus 300 of FIG. 3 may also be a component in a thermal neutron detector 400, as shown in FIG. 4, according to one embodiment. In such an embodiment, a neutron sensitive material 402 may be present in one or more portions of the cavity regions 318 between the p+ coated pillars (i.e., the pillars having the p+ layer 320 deposited on the periphery thereof). In various approaches, the neutron sensitive material 402 may include an atomic or molecular medium, a polymer, semiconductor, dielectric, etc. In particular approaches, the neutron sensitive material 402 may be 10B; a compound containing $^{10}$B (e.g., natural boron, natural boron carbide, $^{10}$B nitride, etc.); Li (e.g., pure $^6$Li) a compound containing $^6$Li (e.g., $^6$Li fluoride); $^{155}$Gd; $^{157}$Gd; or other suitable neutron sensitive/conversion material as would become apparent to one having skill in the art upon reading the present disclosure. In preferred approaches, the neutron sensitive material 402 may be $^{10}$B.

As noted above, the neutron sensitive material 402 may be configured to produce energetic ions upon interaction with a thermal neutron, which can then enter the intrinsic layer 306 and create electron-hole pairs therein. A voltage may then be applied to a pair of electrical contacts (e.g., electrodes) 404, 406 coupled to the upper and/or lower surfaces of the thermal neutron detector 400 to promote the collection of the electrical signals generated by the electron-hole pairs. Processing hardware 408 of a type known in the art may be coupled to the contacts 404, 406 for detecting, processing, etc. the electrical signals generated by the neutron interaction with the neutron sensitive material 402. Any known detector components (e.g. pre-amplifiers, amplifiers, multichannel analyzers, computers, etc.) may be used in combination with the novel structures presented herein to create neutron detectors, according to various embodiments.

Figure 5:
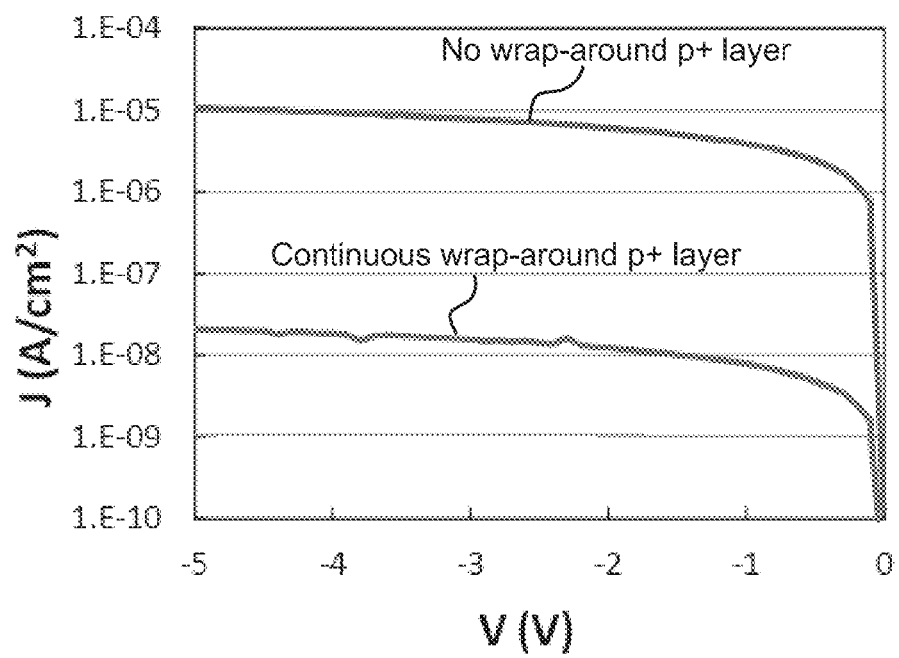
FIG. 5 shows a plot of reverse current as a function of voltage for the thermal neutron detector of FIG. 1, which does not include a continuous wrap-around p+ layer, and the thermal neutron detector of FIG. 4, which does include a continuous wrap-around p+ layer.
Figure 6:
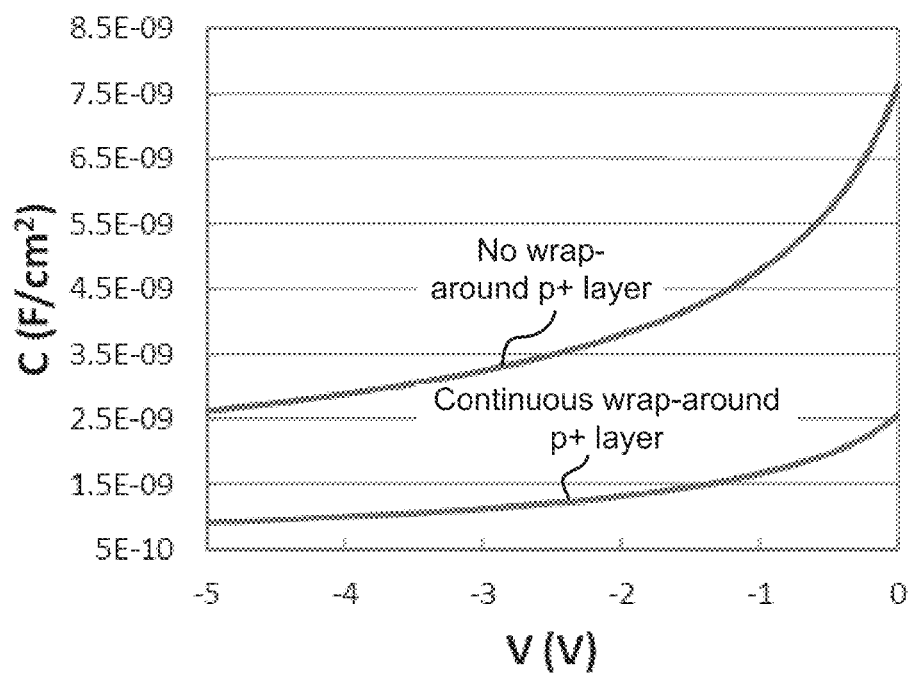
FIG. 6 shows a plot of capacitance as a function of voltage for the thermal neutron detector of FIG. 1, which does not include a continuous wrap-around p+ layer, and the thermal neutron detector of FIG. 4, which does include a continuous wrap-around p+ layer.
Figure 7:
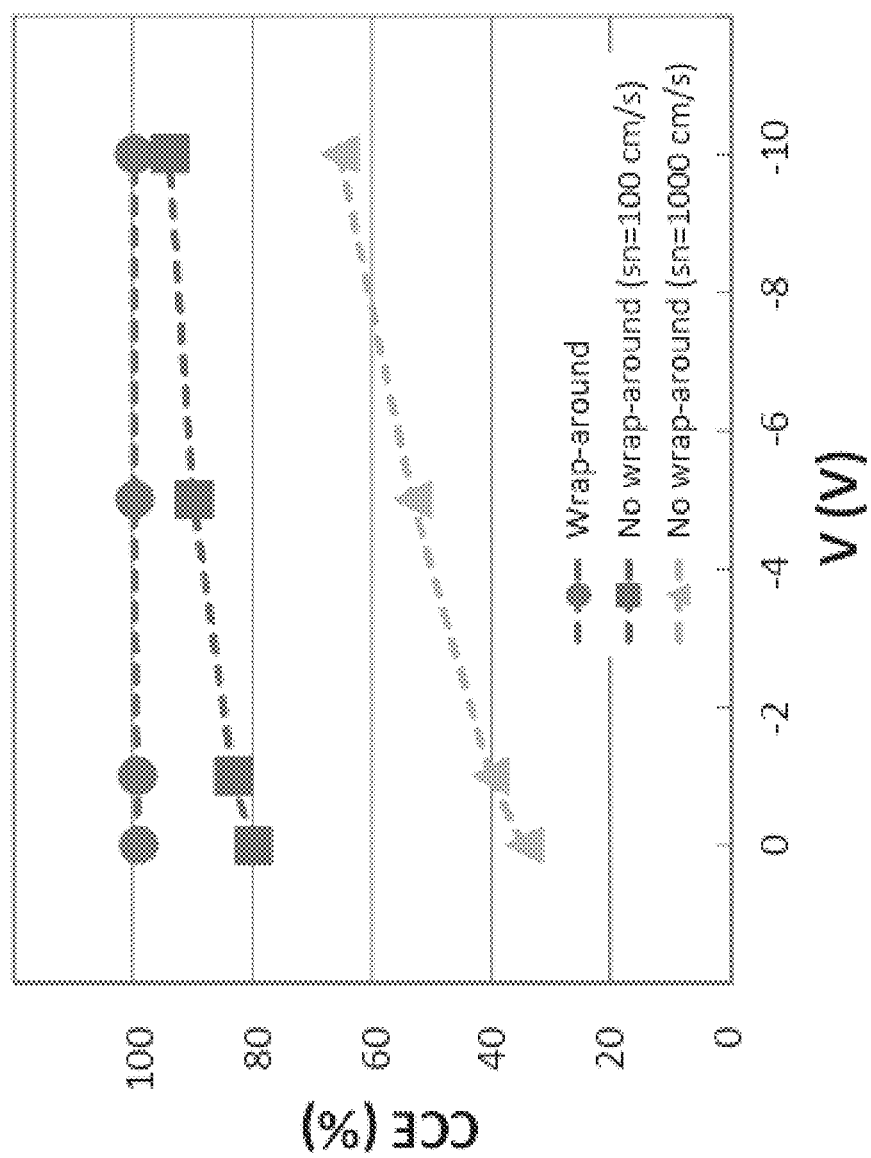
FIG. 7 shows a plot of charge collection efficiency as a function of voltage for the thermal neutron detector of FIG. 1, which does not include a continuous wrap-around p+ layer, and the thermal neutron detector of FIG. 4, which does include a continuous wrap-around p+ layer.

The electrical performance of the thermal neutron detector 400 of FIG. 4 including the continuous wrap-around p+ layer 320 compared to that of the thermal neutron detector 100 of FIG. 5, which does not include a continuous wrap-around p+ layer, is shown in FIGS. 5-7. For instance, FIG. 5 provides a plot of reverse current as a function of voltage; and FIG. 6 provides a plot of the capacitance as a function of voltage. As evident in FIGS. 5 and 6, the presence of the continuous wrap-around p+ layer 320 in the thermal neutron detector 400 of FIG. 4 results in a reduced reverse current and capacitance.

FIG. 7 illustrates the differences in charge collection efficiency as a function of voltage that results from the presence or absence of the continuous wrap-around p+ layer 320. As noted above, the presence of the continuous wrap-around p+ layer 320 in the thermal neutron detector 400 of FIG. 4 creates an electric field which fully depletes the intrinsic layer 306 of the pillars 302 under zero applied bias, thus leading to the full collection of generated charges. In contrast, for the apparatus 100 of FIG. 1 in which a continuous wrap-around p+ layer is absent, charges may be lost in the quasi-neutral region, decreasing the overall charge collection efficiency.

With continued reference to FIGS. 3 and/or 4, select portions of the continuous wrap-around p+ layer 320 may be removed to further lower the capacitance and leakage current of the apparatus in preferred embodiments. For instance, removal of select portions of the continuous wrap-around p+ layer 320 may reduce the capacitance by about 50 times.

FIG. 8 provides one such preferred embodiment of an apparatus 800 including a three dimensional array of pillars 302 and a selective wrap-around p-type conductive layer 802. As FIG. 8 depicts one exemplary variation of the apparatus 300 of FIG. 3, components of FIG. 8 have common numbering with those of FIG. 3.

As shown in FIG. 8, the apparatus 800 includes a p+ layer 802 deposited directly on the periphery (i.e., the sidewalls 312 and the top/upper surface 314) of each of the pillars 302. It is important to note that the p+ layer 802 is present only on the periphery of each of the pillars 302, and is not present on (i.e., is absent from) the upper surface 310 of the planar portion 308 of the intrinsic layer 306 between and adjacent to the p+ coated pillars (e.g., is not present in one or more of the regions 322). In various approaches, the p+ layer 802 shown in FIG. 8 may also be referred to as a "selective wrap-around p+ layer" because the p+ layer coats/wraps only the periphery of each pillar 302.

In some approaches, the selective wrap-around p+ layer 802 may include a semiconductor material. In particular approaches, the selective wrap-around p+ layer 802 may include at least one of Si, SiC, Ge, GaAs, AlGaAs, GaP, GaN, InN, InP, AlGaN, etc. or other suitable semiconductor material as would become apparent to one skilled in the art upon reading the present disclosure. In various approaches, the selective wrap-around p+ layer 802 may include one or more materials that are the same or different than the material(s) present in the n+ layer 304 and/or the intrinsic layer 306. In preferred approaches, the selective wrap-around p+ layer 802 may include or be p+ doped silicon.

In more approaches, a minimum thickness of the selective wrap-around p+ layer 802 may be about 100 Å. In further approaches, a maximum thickness of the selective wrap-around p+ layer 802 may be about 25% of the average maximum width of the pillars 302. In more approaches, the selective wrap-around p+ layer 802 has a p-type doping concentration that is greater than or equal to about 100 times that of the n-type doping concentration in the intrinsic layer 306.

In particular approaches, the apparatus 800 including the selective wrap-around p+ layer 802 may have a capacitance that is $1/50^{th}$ that of an apparatus which includes a continuous wrap-around p+ layer but is otherwise identical (see e.g., apparatus 300 of FIG. 3). In preferred approaches, the apparatus 800 including the selective wrap-around p+ layer 802 may have a capacitance that is less than or equal to about 0.2 nF/cm$^2$.

In some approaches where the intrinsic layer 306 includes silicon, has an n-type doping concentration of about $1 \times 10^{14}$ cm$^{-3}$ and is fully depleted, the apparatus 800 of FIG. 8 including the selective wrap-around p+ layer 802 may have a capacitance at 0 V of about 0.06 nF/cm$^2$. It is important to note that the configuration of apparatus 800 makes the capacitance thereof independent of the n-type doping concentration in the intrinsic region 306 provided that full depletion of the intrinsic region in each pillar is maintained. Consequently, the n-type doping concentration in the intrinsic region 306 may be as high as $1 \times 10^{16}$ cm$^{-3}$ to reduce the leakage current.

As also shown in FIG. 8, the apparatus 800 may include an optional passivation layer 804 present on the upper surface 310 of the planar portion 308 of the intrinsic layer 306 between and adjacent to the p+ coated pillars (e.g., in one or more of the regions 322). In various approaches, the passivation layer 804 may be configured to prevent the surface recombination and the surface charge. In particular approaches, the passivation layer 804 may include at least one of a dielectric material, e.g., SiO$_2$ or SiN, a polymeric material, or other such suitable material as would become apparent to one having skill in the art upon reading the present disclosure. In other approaches, the passivation layer 804 may be substantially comprised of air. In additional approaches, the passivation layer 804 may have a thickness in a range from 100 Å to 1 μm.

The apparatus 800 may also be a component in a thermal neutron detector 900 as shown in FIG. 9, according to one embodiment. In such an embodiment, a neutron sensitive material 902 may be present in one or more portions of the cavity regions 318 that are between the p+ coated pillars (i.e., the pillars having the p+ layer 802 deposited on the periphery thereof). In various approaches, the neutron sensitive material 902 may include an atomic or molecular medium, a polymer, semiconductor, dielectric, etc. In particular approaches, the neutron sensitive material 902 may be $^{10}$B; a compound containing $^{10}$B (e.g., natural boron, natural boron carbide, $^{10}$B nitride, etc.); Li (e.g., pure $^6$Li) a compound containing $^6$Li (e.g., $^6$Li fluoride); $^{155}$Gd; $^{157}$Gd; or other suitable neutron sensitive/conversion material as would become apparent to one having skill in the art upon reading the present disclosure. In preferred approaches, the neutron sensitive material 902 may be $^{10}$B.

As noted above, the neutron sensitive material 902 may be configured to produce energetic ions upon interaction with a thermal neutron, which can then enter the intrinsic layer 306 and create electron-hole pairs therein. Therefore, a pair of electrical contacts (e.g., electrodes) 904, 906 are coupled to the upper and/or lower surfaces of the thermal neutron detector 900 to promote the collection of the electrical signals generated by the electron-hole pairs. Processing hardware 908 of a type known in the art may be coupled to the contacts 904, 906 for detecting, processing, etc. the electrical signals generated by the neutron interaction with the neutron sensitive material 902. Any known detector components (e.g. pre-amplifiers, amplifiers, multi-channel analyzers, computers, etc.) may be used in combination with the novel structures presented herein to create neutron detectors, according to various embodiments.

While not specifically shown in FIGS. 3, 4, 8, and 9, it is important to note that in alternative approaches, the apparatuses 300, 400, 800 and/or 900 may also include n-i-p structures comprising high aspect ratio pillars 302 with a continuous or selective wrap-around n-type conductive layer thereon. For instance, in such alternative approaches, the apparatuses 300 and/or 400 shown in FIGS. 3 and 4, respectively, may include structures having: a p+ layer 304; an intrinsic (n-) layer 306 positioned above the p+ layer 304, where the intrinsic layer includes a planar portion 308 and pillars 302 that protrude from and extend above the upper surface 310 of the planar portion 308; and a continuous wrap-around n+ layer 320 deposited directly on the periphery of each of the pillars 302 and the upper surface 310 of the planar portion 308 of the intrinsic layer 306 between and/or adjacent to the n+ coated pillars. In other approaches, the apparatuses 800 and/or 900 shown in FIGS. 8 and 9, respectively, may also include structures where this n+ layer may be a selective wrap-around n+ layer 802 present only on the periphery of the pillars 302.

FIG. 10 provides a plot of detector size (tile size) versus capacitance for various three dimensional p-i-n semiconductor detectors. For example, detectors 1002 and 1004 are both similar in configuration to the apparatus 300 of FIG. 3, each having an array of three dimensional pillars and a continuous wrap-around p+ layer. However, comparison between detectors 1002 and 1004 reveals that decreasing the n-type doping concentration in the intrinsic layer by choosing high resistive float zone silicon over less resistive epitaxially grown silicon may lead to further decreases in capacitance per unit area, which ultimately allows production of larger sized detectors. Moreover, FIG. 10 also illustrates that removal of the p+ layer from one or more regions near the base of the pillars leads to yet further improvement in capacitance and detector size. For instance, the detector 1006, which includes an array of three dimensional pillars and a selective wrap-around p+ layer exhibits the lowest capacitance per unit area and largest detector size as compared to detectors 1002 and 1004.

Referring now to FIG. 11, a method 1100 for forming an array of p-i-n structures that may form the support structure of a sensor, such as a thermal neutron detector, is shown according to one embodiment. As an option, the present method 1100 may be implemented in conjunction with features from any other embodiment listed herein, such as those described with reference to the other FIGS. Of course, such a method 1100 and others presented herein may be used in various applications and/or permutations, which may or may not be specifically described in the illustrative embodiments listed herein. Moreover, more or less operations than those shown in FIG. 11 may be included in method 1100, according to various embodiments. Furthermore, while exemplary materials and processing techniques are presented, other known materials and processing techniques may be used for various steps.

As shown in FIG. 11, a substrate 1102 is provided and a photolithographic mask 1104 is applied to an upper surface thereof. See resulting structure 1101. The substrate 1102 includes a n+ layer 1106, an intrinsic (n−) layer 1108 positioned above the n+ layer 1106, and a p+ layer 1110 positioned above the intrinsic layer 1108. In some approaches, the n+ layer 1106 may have an n-type doping concentration in a range from about $1 \times 10^{18}$ cm$^{-3}$ to $1 \times 10^{19}$ cm$^{-3}$. In more approaches, the intrinsic layer 1108 may have an n-type doping concentration in a range from about $1 \times 10^{11}$ dopants/cm$^{-3}$ to about $1 \times 10^{16}$ dopants/cm$^{-3}$.

In various approaches, the substrate 1102 may include a semiconductor material including, but not limited to: Si, SiC, GaAs, AlGaAs, GaP, GaN, InN, InP, AlGaN, etc. or other suitable semiconductor material as would become apparent to one skilled in the art upon reading the present disclosure. In preferred approaches, the substrate 1102 may include or be silicon.

As also shown in FIG. 11, the substrate 1102 is then etched to form an array of pillars 1112 having cavity regions 1132 therebetween, with the array pattern defined by the photolithographic mask 1104. See resulting structure 1103. The upper portion 1144 of each of the pillars 112 includes the p+ layer 110.

Etching the substrate 1102 may include such techniques as dry etching by high density plasma (e.g. reactive ion etching), wet etching with or without use of a surfactant, metal-assisted chemical etching, etc. Additionally, in approaches where the substrate 1102 has been etched using a high density plasma etch, an optional step may include further wet etching the pillar surfaces using a surfactant or other etches that etch silicon in order to remove any plasma etch damage. Surfactants used during the wet etching may include ammonium fluoro alkyl sulfonamide in water or potassium hydroxide with isopropyl alcohol.

In various approaches, the substrate 1102 may be etched all the way through the intrinsic layer 1108 up to the upper surface of the n+ layer 1106. However, in preferred approaches, the substrate 1102 may be partially etched into the intrinsic layer 1108, such that the resulting intrinsic layer 1108 includes a planar portion 1114 with the pillars 1112 extending thereabove. In approaches where the substrate 1102 is partially etched into the intrinsic layer 1108, a thickness, $t_p$, of the planar portion of the intrinsic layer 1108 may be in a range from 0 μm to about 500 μm.

It is important to note that the geometry, arrangement and cross sectional shape or the pillars 1112 are not limited to that imposed by the particular photolithographic mask 1104 shown in FIG. 11. For example, in various approaches, the cross sectional shapes of the pillars 1112 may include, but are not limited to: a square, octagon, hexagon, star, triangle, circle, ellipsoid, etc., or other such suitable shapes (see e.g., the illustrative cross sectional pillar shapes shown in FIGS. 2A-2G).

In preferred approaches, the pillars 1112 shown in FIG. 11 may include a rounded cross sectional shape, where, as above, the cross section is taken perpendicular to a longitudinal axis of the pillars 1112. In some approaches, a pillar 1112 with a rounded cross sectional shape may be formed using a lithographic mask with the rounded feature therein. Alternatively, in other approaches, the lithographic mask may contain sharp corners thereby producing pillars 1112 with sharp corners that may subsequently be rounded, e.g., by overexposure during the lithographic exposure step, photoresist reflow, wet etching or plasma etching, etc.

Additionally, it is important to note that the array of pillars 1112 is not limited to individual pillar structures, but may include ridges or other suitable three dimensional structures as would become apparent to one having skill in the art upon reading the present disclosure.

In more approaches, the pitch, p, between at least two adjacent pillars 1112 may be in a range from about 2 μm to about 10 μm. Further, the separation, s, between at least two adjacent pillars 1112 may be in a range from about 1 μm to about 10 μm. In yet more approaches, the separation between at least some (e.g., less than a majority), a majority, or all of the pillars 1112 may be about uniform. For instance, in one approach, the array of pillars 1112 may be arranged in a hexagonally close packed (HCP) array. However, in other approaches, the separation between at least some (e.g., less than a majority), a majority, or all of the pillars 1112 may not be uniform.

In still more approaches, each of the pillars 1112 may have a maximum width, w, in a range from about 0.1 to about 10 μm. Discounting (i.e., not including) the thickness of the p+ layer 1110 of the substrate 1102, each of the pillars 1112 may also have a height, h, of about 0.1 to about 100 μm, e.g., about 50 μm in preferred approaches. Again discounting the thickness of the p+ layer 1110 of the substrate 1102, each of the pillars 1112 may additionally have a high aspect ratio in a range from about 1:1 to about 1000:1 (e.g., about 1:1, about 10:1, about 25:1, about 50:1, about 100:1, etc.) or higher.

As shown in FIG. 11, after the pillars 1112 have been formed, a continuous wrap-around p+ layer 1116 may be deposited on the periphery (i.e., the sidewalls 1118 and top/upper surface 1120) of the pillars 1112 as well as the upper surface 1122 of the exposed substrate between the pillars 1112. See resulting structure 1105. The continuous wrap-around p+ layer 1116 may be deposited via chemical vapor deposition (CVD), solid source diffusion doping, immersion ion implantation, gaseous diffusion doping, spin-on coating of dopants, application of a doped silica glass coat followed by diffusion, or other suitable deposition technique as would be become apparent to one having skill in the art upon reading the present disclosure.

In preferred approaches, the continuous wrap-around p+ layer 1116 conformally coats the periphery of the pillars 1112 as well as the upper surface 1122 of the substrate between the p+ coated pillars. In more preferred approaches, this conformal continuous wrap-around p+ layer 1116 may have a minimum thickness of 100 Å and a maximum thickness corresponding to less than or equal to about 25% of the average maximum width of the pillars 1112. The average maximum width of the pillars 1112 may range from about 0.1 to about 10 μm in some approaches.

In further approaches, the continuous wrap-around p+ layer 1116 may include one or more semiconductor materials that are the same or different from the substrate 1102 material(s). These semiconductor materials may include but are not limited to: Si, SiC, GaAs, AlGaAs, GaP, GaN, InN, InP, AlGaN, etc. or other suitable semiconductor material as would become apparent to one skilled in the art upon reading the present disclosure. In particular approaches, the continuous wrap-around p+ layer 1116 may include or be p+ doped silicon.

In other approaches, the continuous wrap-around p+ layer 1116 may have a p-type doping concentration that is greater than or equal to about 100 times that of the n-type doping concentration in the intrinsic layer 1108 of the substrate 1102.

While not show in FIG. 11, the p+ layer 1110 of the substrate 1102 may be optionally removed prior to the etching of the substrate 1102 or prior to the deposition of the continuous wrap-around p+ layer 1116. The p+ layer 1110 of the substrate 1102 may be removed via deep reactive ion etching, chemical etching (e.g., using an ammonium fluoride-nitric acid solution), etc.

As further shown in FIG. 11, an optional first etch mask 1140 may be deposited above the continuous wrap-around p+ layer 1116. See resulting structure 1107. In preferred approaches, the first etch mask 1140 may be deposited on the p+ layer 1116 present on the periphery of the pillars 1112, as well as on the p+ layer 1116 present on the upper surface 1122 of the substrate between the p+ coated pillars 1112. In particular approaches, the first etch mask 1140 may be a lithographically defined photoresist or a dielectric layer. In further approaches, the first etch mask 1140 may include $SiO_2$, SiN, or other suitable material as would become apparent to one skilled in the art upon reading the present disclosure.

An optional second etch mask 1142 may be deposited above the first etch mask 1140. See resulting structure 1109. In preferred approaches, the second etch mask 1142 may only protect (e.g., only be deposited on) the top/upper surfaces of the p+ coated pillars having the first etch mask 1140 thereon. In some approaches, the second etch mask 1142 may be a lithographically defined photoresist or a dielectric layer. In more approaches, the second etch mask 1142 may include $SiO_2$, SiN or other suitable material as would become apparent to one skilled in the art upon reading the present disclosure. In yet more approaches, the second etch mask 1142 and the first etch mask 1140 may include one or more materials that are the same. In still more approaches, the second etch mask 1142 and the first etch mask 1140 may include one or more materials that are different such that an etching process may selectively etch the first etch mask 1140 without etching some, a majority or an entirety of the second etch mask 1142.

As shown in FIG. 11, select portions of the first etch mask 1140 and continuous wrap-around p+ layer 1116 may be removed from one or more regions of the upper surface 1122 of the substrate 1102 between the p+ coated pillars having the first etch mask 1140 thereon. See resulting structure 1111, which depicts the first etch mask 1140 and the p+ layer 1116 layer removed from one or more of the regions 1138, thereby yielding a selective wrap-around p+ layer 1124 and the first etch mask 1140 deposited only on the periphery of the pillars 1112.

In various approaches, the select removal of the first etch mask 1140 and the continuous wrap-around p+ layer 1116 from one or more of the regions 1138 may be achieved via a highly directional plasma etching process under such conditions that the second etch mask 1142 on the top of the pillars 1112 is not completely removed while the first etch mask 1140 and the underlying p+ doped layer 1116 present on the planar portion of the intrinsic region is etched. For instance, the highly directional plasma etching process may attack the upper surface 1126 of the first etch mask 1140 and the underlying p+ layer 1116 that is perpendicular to the incident direction of the ion beam while leaving intact: the first etch mask 1140 and the p+ layer 1116 on the sidewalls 1118 of the pillars 1112, as well as the second etch mask 1142 on the tops/upper surfaces of the pillars 1112. As this plasma etching is directional (i.e., surfaces perpendicular to, but not parallel to, the incident direction of the ion beam are etched), a certain amount of the second etch mask 1142 present on the top/upper surface 1120 of each pillar 1112 may also be removed.

In approaches where the option second etch mask 1142 is not applied, it may be desirable, prior to the directional plasma etching process, for the first etch mask 1140 on the top/upper surface 1120 of each p+ coated pillar 1112 to have an initial thickness that is greater than: the thickness of the first etch mask 1140 on the sidewalls 1118 of the p+ coated pillars 1112 and the upper surface 1126 of the first etch mask 1140 between the p+ coated pillars. Likewise, in approaches where the option second etch mask 1142 and the first etch mask 1140 are not applied, it may be desirable, prior to the directional plasma etching process, for the p+ layer 1116 on the top/upper surface 1120 of each pillar 1112 to have an initial thickness that is greater than: the conformal thickness of the p+ layer 1116 on the sidewalls 1118 of the pillars 1112 and the upper surface 1122 of the substrate between the p+ coated pillars.

In more approaches, the directional (anisotropic) plasma etching may be enhanced by the use of fluorocarbon gases such as $CHF_3$, $CF_4$, $C_3F_8$ etc. Such gases produce unsaturated compounds in the plasma, leading to polymer formation and deposition on the substrate surface as well as the pillar sidewalls. However, as the etching is directional, as noted above, the surfaces perpendicular to the incident plasma beam are etched while those surfaces parallel to the incident plasma beam are protected from the polymer formation and etching process.

With continued reference to FIG. 11, after the select removal of the first etch mask 1140 and the p+ layer 1116 from one or more of the regions 1138, the remaining portions of the first etch mask 1140 and the second etch mask 1142 are then removed. See resulting structure 1113. In various approaches, the first etch mask 1140 and/or the second etch mask 1142 may be removed via a wet chemical etch. As discussed previously, structures (such as structure 1113) including a selective wrap-around p+ layer 1124 have a capacitance and leakage current that is significantly less than that of a structure having either a continuous wrap-around p+ layer 1116 or no wrap-around p+ layer. Accordingly, structures including this selective wrap-around p+ layer 1124 may be less inhibited by capacitance- and leakage current-related noise, and may therefore be particularly useful for large-area detection applications. In particular approaches, structures (such as structure 1113) including a selective wrap-around p+ layer 1124 may have a capacitance of less than about 0.2 $nF/cm^2$.

The method 1100 may also optionally include depositing a passivation layer 1128 in one or more regions where the first etch mask 1140 and the p+ layer 1116 were selectively removed. See resulting structure 1115. In particular approaches, the passivation layer 1128 may include at least one of a dielectric material, e.g., $SiO_2$ or SiN, a polymeric material, or other such suitable material as would become apparent to one having skill in the art upon reading the present disclosure. In other approaches, the passivation layer 1128 may be substantially comprised of air.

The method 1100 may further include the optional deposition (e.g., via CVD, solution, nanoparticle based approaches, etc.) of a neutron sensitive material 1130 in one or more portions of the cavity regions 1132 between one or more of the p+ coated pillars 1112. See resulting structure 1117. This neutron sensitive material 1130 may include, but is not limited to: $^{10}$B; a compound containing $^{10}$B (e.g., natural boron, natural boron carbide, $^{10}$B nitride, etc.); Li (e.g., pure $^{6}$Li) a compound containing $^{6}$Li (e.g., $^{6}$Li fluoride); $^{155}$Gd; $^{157}$Gd; etc.

In various approaches, deposition of the neutron sensitive material 1130 may result in the neutron sensitive material 1130 extending above the tops/upper surfaces of the p+ coated pillars 1112. In such approaches where the thickness, $t_n$, of the neutron sensitive material 1130 exceeds the total height (etch depth), $h_{total}$, of the p+ coated pillars 1112, the neutron sensitive material 1130 extending above the pillars 1112 may be etched back so that at least a section of the tops/upper surfaces of the p+ coated pillars 1112 is exposed. Etching back the neutron sensitive material 1130 may be achieved using such techniques as plasma beam etching, ion beam etching, lapping, applying an adhesive to delaminate or "tear off" the top layer, etc. After such an etching process, the thickness, $t_n$, of the remaining neutron sensitive material 1130 may be equal to the total height, $t_{total}$, of the p+ coated pillars 1112, as shown in structure 1111. However, in other approaches, the thickness, $t_n$, of the remaining neutron sensitive material 1130 may be less than the total height, $h_{total}$, of the p+ coated pillars 1112.

As additionally shown in FIG. 11I, the method 1100 may include depositing electrical contacts 1134, 1136 on the tops/upper surfaces of the p+ coated pillars 1112 and the lower surface of the n+ layer 1106 of the substrate 1102. See resulting structure 1119. In various approaches, the electrical contacts 1134, 1136 may be conformal conductive metalized layers, such as those known in the art.

Referring now to FIG. 12, a method 1200 for forming an array of n-i-p structures that may form the support structure of a sensor, such as a thermal neutron detector, is shown according to one embodiment. As an option, the present method 1200 may be implemented in conjunction with features from any other embodiment listed herein, such as those described with reference to the other FIGS. Of course, such a method 1200 and others presented herein may be used in various applications and/or permutations, which may or may not be specifically described in the illustrative embodiments listed herein. Moreover, more or less operations than those shown in FIG. 12 may be included in method 1200, according to various embodiments. Furthermore, while exemplary materials and processing techniques are presented, other known materials and processing techniques may be used for various steps.

As shown in FIG. 12, the method 1200 involves providing a substrate including a p+ layer, an intrinsic layer positioned above the p+ layer, and an n+ layer positioned above the intrinsic layer. See operation 1202. After application of the photolithographic mask to the surface of the substrate, the substrate is etched (e.g., via dry etching processes, wet etching processes, metal-assisted chemical etching, etc.) to from an array of pillars having cavity regions therebetween, with the array defined by the photolithographic mask. See operation 1204. In various approaches, the substrate may be etched all the way through the intrinsic layer up to the upper surface of the p+ layer. However, in preferred approaches, the substrate may be partially etched into the intrinsic layer, such that the resulting intrinsic layer includes a planar portion with the pillars extending thereabove.

As also shown in FIG. 12, after the pillar have been formed, a continuous wrap-around n+ layer may be deposited on the periphery (i.e., the sidewalls and top/upper surface) of the pillars, as well as the upper surface of the exposed substrate between the pillars. See operation 1206. In some approaches, the continuous wrap-around n+ layer may be deposited via chemical vapor deposition (CVD), solid source diffusion doping, immersion ion implantation, gaseous diffusion doping, spin-on coating of dopants, application of a doped silica glass coat followed by diffusion, etc.

In preferred approaches, the continuous wrap-around n+ layer conformally coats the periphery of the pillars as well as the upper surface of the substrate between the n+ coated pillars. In more preferred approaches, this conformal continuous wrap-around n+ layer may have a minimum thickness of 100 Å and a maximum thickness corresponding to less than or equal to about 25% of the average maximum width of the pillars. The average maximum width of the pillars may range from about 0.1 to about 10 m in some approaches.

In more approaches, the continuous wrap-around n+ layer may have a n-type doping concentration that is greater than or equal to about 100 times that of the n-type doping concentration in the intrinsic layer of the substrate, where the intrinsic layer may have an n-type doping concentration in a range from about $1 \times 10^{11}$ dopants/cm$^{-3}$ to about $1 \times 10^{16}$ dopants/cm$^{-3}$.

While not show in FIG. 12, the n+ layer of the substrate may be optionally removed prior to the etching of the substrate or prior to the deposition of the continuous wrap-around n+ layer. The n+ layer of the substrate may be removed via deep reactive ion etching, chemical etching (e.g., using an ammonium fluoride-nitric acid solution), etc.

As shown in FIG. 12, an optional first etch mask may be deposited on the continuous wrap-around n+ layer. See operation 1208. In preferred approaches, the first etch mask is deposited on the n+ layer present on the periphery of the pillars, as well as on the n+ layer present on the upper surface of the substrate between the n+ coated pillars.

The method 1200 may also include depositing an optional second etch mask on the first etch mask. See operation 1210. In preferred approaches, the second etch mask may only protect (e.g., only be deposited on) the top/upper surfaces of the n+ coated pillars having the first etch mask thereon.

As further shown in FIG. 12, select portions of the first etch mask and continuous wrap-around n+ layer may be removed (e.g., via a highly directional plasma etching process) from one or more regions of the upper surface of the substrate between the n+ coated pillars having the first etch mask thereon. See operation 1212. Such select removal yields a selective wrap-around n+ layer and the first etch mask deposited only on the periphery of the pillars.

After the select removal of the first etch mask and the n+ layer from one or more of the regions of the upper surface of the substrate between the n+ coated pillars, the remaining portions of the first etch mask and the second etch mask are then removed. See operation 1214. In particular approaches, the pillar structures including the selective wrap-around n+ layer may have a capacitance of less than about 0.2 nF/cm$^2$.

An optional passivation layer may also deposited (e.g., via CVD, solution, nanoparticle based approaches, etc.) in one or more regions between the n+ coated pillars where the first etch mask and the n+ layer were selectively removed. See operation 1216. In particular approaches, the passivation layer may include at least one of a dielectric material, e.g., SiO$_2$ or SiN, a polymeric material, or other such suitable material as would become apparent to one having skill in the art upon reading the present disclosure. In other approaches, the passivation layer may be substantially comprised of air.

The method 1200 may additionally include the optional deposition of deposition of a neutron sensitive material in one or more portions of the cavity regions between each of the n+ coated pillars. See operation 1218. This neutron sensitive material may include, but is not limited to: $^{10}$B; a compound containing $^{10}$B (e.g., natural boron, natural boron carbide, $^{10}$B nitride, etc.); Li (e.g., pure $^{6}$Li) a compound containing $^{6}$Li (e.g., $^{6}$Li fluoride); $^{155}$Gd; $^{157}$Gd; etc.

In various approaches, deposition of the neutron sensitive material may result in the neutron sensitive material extending above the tops/upper surfaces of the n+ coated pillars. In such approaches where the thickness of the neutron sensitive material exceeds the total height (etch depth) of the n+ coated pillars, the neutron sensitive material extending above the pillars may be etched back so that at least a section of the tops/upper surfaces of the n+ coated pillars is exposed. Etching back the neutron sensitive material may be achieved using such techniques as plasma beam etching, ion beam etching, lapping, applying an adhesive to delaminate or "tear off" the top layer, etc. After such an etching process, the thickness of the remaining neutron sensitive material may be equal to or less than the total height of the n+ coated pillars.

As shown in FIG. 12, the method 1200 may include depositing electrical contacts on the tops/upper surfaces of the n+ coated pillars and the lower surface of the p+ layer of the substrate. See operation 1220. In various approaches, the electrical contacts may be conformal conductive metalized layers, such as those known in the art.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

It should be noted that any of the methods described herein, taken individually or in combination, in whole or in part, may be included in or used to make apparatuses, systems, structures, etc. Moreover, any of the features presented herein may be combined in any combination to create various embodiments, any of which fall within the scope of the present invention.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
   a first layer including an n+ dopant or a p+ dopant;
   an intrinsic layer grown or deposited above the first layer, the intrinsic layer including a planar portion and pillars extending above the planar portion, wherein cavity regions are defined between the pillars;
   a second layer deposited on a periphery of the pillars thereby forming coated pillars, wherein the second layer is substantially absent on the planar portion of the intrinsic layer between the coated pillars, wherein the second layer includes a n+ dopant when the first layer includes a p+ dopant, wherein the second layer includes a p+ dopant when the first layer includes a n+ dopant; and
   a neutron sensitive material deposited between the coated pillars and above the planar portion of the intrinsic layer.

2. The apparatus as recited in claim 1, wherein the apparatus has a capacitance of less than about 0.2 nF/cm$^2$.

3. The apparatus as recited in claim 1, wherein the pillars have an average aspect ratio of about 25:1.

4. The apparatus as recited in claim 1, wherein each pillar has a width in a range from about 0.1 μm to about 10 μm.

5. The apparatus as recited in claim 4, wherein a thickness of the second layer is greater than or equal to about 100 Å.

6. The apparatus as recited in claim 5, wherein the thickness of the second layer is less than or equal to about 25% of an average width of the pillars.

7. The apparatus as recited in claim 1, wherein at least one of the first layer, the intrinsic layer and the second layer comprise silicon.

8. The apparatus as recited in claim 1, wherein at least one of the first layer, the intrinsic layer and the second layer comprise an III-V or II-VI semiconductor material.

9. The apparatus as recited in claim 8, wherein the semiconductor material is selected from a group consisting of Si, SiC, GaAs, AlGaAs, GaN, AlGaN, InP, InGaAsP, and GaP.

10. The apparatus as recited in claim 1, wherein the intrinsic layer has an n-type doping concentration in a range from about $1 > 10^{11}$ dopants/cm$^{-3}$ to about $1 \times 10^{16}$ dopants/cm$^{-3}$.

11. The apparatus as recited in claim 10, wherein the second layer includes a p+ dopant with a p+ doping concentration that is greater than or equal to about 100 times that of the n-type doping concentration in the intrinsic layer.

12. The apparatus as recited in claim 1, further comprising a passivation layer deposited on the planar portion of the intrinsic layer between the coated pillars.

13. The apparatus as recited in claim 12, wherein the passivation layer comprises a dielectric material.

14. The apparatus as recited in claim 12, wherein the passivation layer comprises an oxide.

15. The apparatus as recited in claim 1, wherein each of the pillars has an upper portion positioned farthest from the planar portion of the intrinsic layer, wherein the upper portion of each of the pillars includes a same type of dopant as the second layer.

16. A method of forming the apparatus of claim 1, comprising:
   providing a substrate comprising the first layer and the intrinsic layer;
   removing portions of the intrinsic layer to form the pillars and the cavity regions therebetween;
   depositing the second layer on the periphery of the pillars and the planar portion of the intrinsic layer between the coated pillars;
   protecting the second layer with a first etch mask;
   protecting each top of the coated pillars having the first etch mask thereon with a second etch mask;
   removing the second layer and first etch mask from the planar portion of the intrinsic layer between the coated pillars;
   removing the second etch mask from each top of the coated pillars;
   removing the first etch mask from the periphery of the coated pillars; and depositing the neutron sensitive material between the coated pillars and above the planar portion of the intrinsic layer.

17. The method as recited in claim 16, wherein depositing the second layer comprises a technique selected from a group consisting of: solid source diffusion doping, immersion ion implantation, gaseous diffusion doping, and spin coating.

18. The method as recited in claim 16, wherein removing the second layer and the first etch mask from the planar portion of the intrinsic layer between the coated pillars comprises a highly directional plasma etching process.

19. The method as recited in claim 16, further comprising depositing a passivation layer on the planar portion of the intrinsic layer between the coated pillars prior to depositing the neutron sensitive material.

20. An apparatus, comprising:
  a first layer including an n+ dopant or a p+ dopant;
  an intrinsic layer grown or deposited above the first layer, the intrinsic layer including a planar portion and pillars extending above the planar portion, wherein cavity regions are defined between the pillars;
  a second layer deposited on a periphery of the pillars thereby forming coated pillars, wherein the second layer is substantially absent on the planar portion of the intrinsic layer between the coated pillars, wherein the second layer includes a p+ dopant when the first layer includes a n+ dopant, wherein the second layer includes a n+ dopant when the first layer includes a p+ dopant;
  a passivation layer deposited on the planar portion of the intrinsic layer between the coated pillars;
  a neutron sensitive material deposited between the coated pillars and above the passivation layer;
  a first electrode in contact with the coated pillars; and
  a second electrode in contact with the first layer,
  wherein the passivation layer includes at least one of a dielectric material and a polymeric material,
  wherein at least one of the first layer, the intrinsic layer and the second layer include an III-V or II-VI semiconductor material.

* * * * *